(12) United States Patent
Henley et al.

(10) Patent No.: US 10,041,187 B2
(45) Date of Patent: Aug. 7, 2018

(54) TECHNIQUES FOR FORMING OPTOELECTRONIC DEVICES

(71) Applicant: QMAT, Inc., San Jose, CA (US)

(72) Inventors: Francois J. Henley, Aptos, CA (US); Sien Kang, Dublin, CA (US); Albert Lamm, Suisun City, CA (US)

(73) Assignee: QMAT, INC., San Jose, CA (US)

( * ) Notice: Subject to any disclaimer, the term of this patent is extended or adjusted under 35 U.S.C. 154(b) by 0 days.

(21) Appl. No.: 14/156,282

(22) Filed: Jan. 15, 2014

(65) Prior Publication Data

US 2014/0197419 A1     Jul. 17, 2014

Related U.S. Application Data

(60) Provisional application No. 61/753,364, filed on Jan. 16, 2013.

(51) Int. Cl.
*C30B 33/06* (2006.01)
*H01L 21/02* (2006.01)
(Continued)

(52) U.S. Cl.
CPC .......... *C30B 33/06* (2013.01); *C30B 29/406* (2013.01); *C30B 33/04* (2013.01); *C30B 33/08* (2013.01);
(Continued)

(58) Field of Classification Search
CPC ................................................. H01L 21/02458
See application file for complete search history.

(56) References Cited

U.S. PATENT DOCUMENTS

| 5,374,564 A | 12/1994 | Bruel |
| 6,013,563 A | 1/2000 | Henley et al. |

(Continued)

FOREIGN PATENT DOCUMENTS

| JP | 2003-332273 A | 11/2003 |
| JP | 2010-232625 A | 10/2010 |

(Continued)

OTHER PUBLICATIONS

Moutanabbir et al, "Bulk GaN Ion Cleaving," J Electron Mater, vol. 39, No. 5, 2010, pp. 482-488.*

(Continued)

*Primary Examiner* — Thao X Le
*Assistant Examiner* — Xia Cross

(57) ABSTRACT

Embodiments relate to use of a particle accelerator beam to form thin films of material from a bulk substrate. In particular embodiments, a bulk substrate (e.g. donor substrate) having a top surface is exposed to a beam of accelerated particles. In certain embodiments, this bulk substrate may comprise GaN; in other embodiments this bulk substrate may comprise Si, SiC, or other materials. Then, a thin film or wafer of material is separated from the bulk substrate by performing a controlled cleaving process along a cleave region formed by particles implanted from the beam. In certain embodiments this separated material is incorporated directly into an optoelectronic device, for example a GaN film cleaved from GaN bulk material. In some embodiments, this separated material may be employed as a template for further growth of semiconductor materials (e.g. GaN) that are useful for optoelectronic devices.

13 Claims, 29 Drawing Sheets

(51) Int. Cl.
*C30B 29/40* (2006.01)
*H01L 21/762* (2006.01)
*C30B 33/04* (2006.01)
*C30B 33/08* (2006.01)
*H01L 33/00* (2010.01)

(52) U.S. Cl.
CPC .. *H01L 21/02458* (2013.01); *H01L 21/76254* (2013.01); *H01L 33/0075* (2013.01)

(56) References Cited

U.S. PATENT DOCUMENTS

| | | | |
|---|---|---|---|
| 7,351,644 B2 | 4/2008 | Henley | |
| 7,390,724 B2 | 6/2008 | Henley et al. | |
| 2005/0026394 A1 | 2/2005 | Letertre et al. | |
| 2005/0082556 A1 | 4/2005 | Sung et al. | |
| 2006/0043419 A1* | 3/2006 | Tachibana | C30B 25/18 257/200 |
| 2006/0087000 A1* | 4/2006 | Okuno | H01L 21/76232 257/506 |
| 2006/0141747 A1* | 6/2006 | Henley | B81C 1/0038 438/455 |
| 2006/0169197 A1* | 8/2006 | Sasaki | C30B 9/10 117/2 |
| 2007/0164298 A1* | 7/2007 | Kim | H01L 33/0079 257/94 |
| 2007/0235074 A1 | 10/2007 | Henley et al. | |
| 2007/0259526 A1 | 11/2007 | Kang et al. | |
| 2008/0128641 A1 | 6/2008 | Henley et al. | |
| 2008/0160661 A1 | 7/2008 | Henley | |
| 2008/0179547 A1 | 7/2008 | Henley | |
| 2008/0206962 A1 | 8/2008 | Henley et al. | |
| 2009/0042369 A1 | 2/2009 | Henley | |
| 2009/0072262 A1* | 3/2009 | Iza | H01L 33/04 257/98 |
| 2009/0111236 A1* | 4/2009 | Kakehata | H01L 21/76254 438/406 |
| 2009/0206275 A1 | 8/2009 | Henley et al. | |
| 2010/0025228 A1 | 2/2010 | Tauzin et al. | |
| 2010/0025714 A1 | 2/2010 | Hsu et al. | |
| 2010/0099100 A1* | 4/2010 | Zaccarin | G01N 21/253 435/6.11 |
| 2010/0178723 A1 | 7/2010 | Henley | |
| 2010/0282323 A1 | 11/2010 | Henley et al. | |
| 2010/0317140 A1 | 12/2010 | Brailove et al. | |
| 2011/0049528 A1 | 3/2011 | Dupont | |
| 2011/0079766 A1* | 4/2011 | Wildeson et al. | 257/13 |
| 2011/0156212 A1* | 6/2011 | Arena | 257/615 |
| 2011/0193127 A1* | 8/2011 | Won | 257/99 |
| 2011/0201176 A1* | 8/2011 | Ramappa et al. | 438/458 |
| 2011/0201184 A1* | 8/2011 | Motoki et al. | 438/492 |
| 2012/0138937 A1* | 6/2012 | Jo | H01L 27/1218 257/59 |
| 2012/0234887 A1* | 9/2012 | Henley | H01L 21/67092 225/1 |
| 2013/0115753 A1* | 5/2013 | Eo et al. | 438/458 |
| 2013/0234148 A1* | 9/2013 | Werkhoven | H01L 29/20 257/76 |
| 2013/0307165 A1* | 11/2013 | Wang | H01L 21/76251 257/782 |
| 2014/0191243 A1* | 7/2014 | Singh | H01L 33/007 257/76 |

FOREIGN PATENT DOCUMENTS

| | | |
|---|---|---|
| JP | 2011-138866 A | 7/2011 |
| JP | 2012-124473 A | 6/2012 |
| KR | 10-2012-0090669 A | 8/2012 |

OTHER PUBLICATIONS

International Search Report and Written Opinion for PCT/US2014/011731, filed Jan. 15, 2014.
S. Hayashi et al., "Chemical Mechanical Polishing of GaN", Journal of the Electrochemical Society, 2008, pp. H113-H116, vol. 155, Issue 2, The Electrochemical Society.
W. K. Choi et al., "Densification of radio frequency sputtered silicon oxide films by rapid thermal annealing", Journal of Applied Physics, Feb. 15, 1998, pp. 2308-2314, vol. 83, No. 4, American Institute of Physics.
Logitech Ltd, "Logitech Polishing Suspensions", http://www.logitech.uk.com/products-solutions/products-and-accessories/consumables/polishing-suspensions.aspx.
Science and Engineering Research Concil, "Lapping & Polishing System", SERC Nanofabrication and Characterisation (SNFC) Facility, http://www.imre.a-star.edu.sg/fckeditor/uploadfiles/F34-SNFC%20Factsheet%20-%20Lapping.pdf.
Jeff Y. Tsao, "Solid-State Lighting: Lamps, Chips and Materials for Tomorrow", IEEE Circuits & Devices, May/Jun. 2004, pp. 28-37, vol. 20, No. 3.
R. Jothilingam et al., "A Study of Cracking in GaN Grown on Silicon by Molecular Beam Epitaxy", Journal of Electronic Materials, 2001, pp. 821-824, vol. 30, No. 7.
C. Gui et al., "The effect of surface roughness on direct wafer bonding", Journal of Applied Physics, May 15, 1999, pp. 7448-7454, vol. 85, No. 10, American Institute of Physics.
N. W. Cheung et al., "Plasma Immersion Ion Implantation for Electronic Materials Applications", Extended Abstracts of the 1995 International Conference on Solid State Devices and Materials, 1995, pp. 351-353, Osaka, Japan.
Paul K. Chu et al., "Plasma immersion ion implantation—a fledgling technique for semiconductor processing", Materials Science and Engineering Reports, Plasma immersion ion implantation—a fledgling technique for semiconductor processing 1996, pp. 207-280, vol. 17, No. 6-7.
N. W. Cheung, "Plasma immersion ion implantation for semiconductor processing", Materials Chemistry and Physics, 1996, pp. 132-139, vol. 46.
V.F. Reutov et al., "Method for Fabricating Thin Silicon Wafers", USSR's Inventors Certificate No. 1282757, Dec. 30, 1983.
M. K. Weldon et al., "On the mechanism of the hydrogen-induced exfoliation of silicon", Journal of Vacuum Science & Technology B: Microelectronics and Nanometer Structures, Jul. 1997, pp. 1065-1073, vol. 15, No. 4, American Vacuum Society.
Extended European Search Report for European Application No. 14740720.9 dated Jul. 4, 2016.

* cited by examiner

- GaN Epi Layer
- GaN Buffer Layer
- Barrier Layer #3
- Electrically Insulating Layer
- Barrier Layer #2
- Thermo-compression Bond Layer #2
- Thermo-compression Bond Layer #1
- Barrier Layer #1
- Molybdenum Alloy Substrate

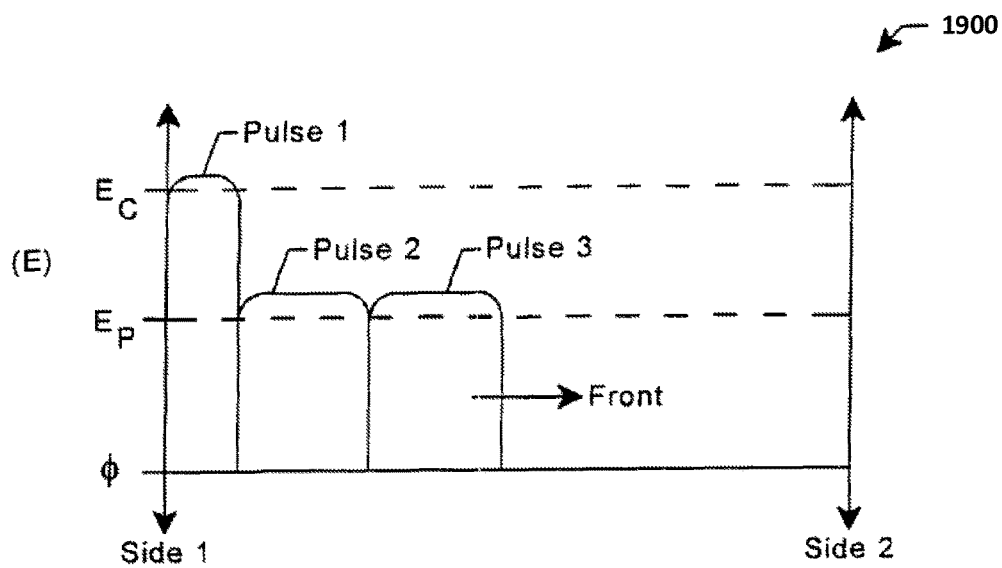
FIG. 19
FIG. 20
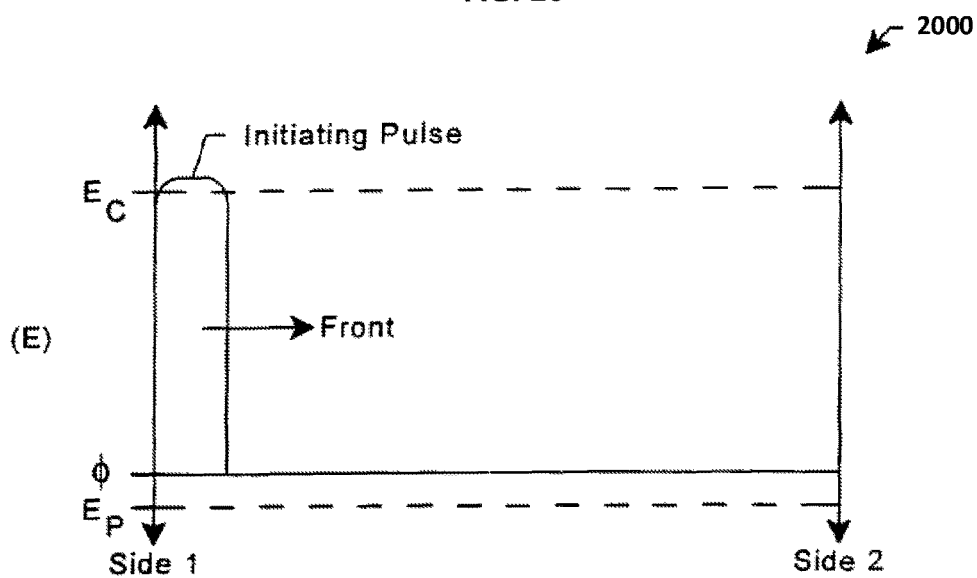

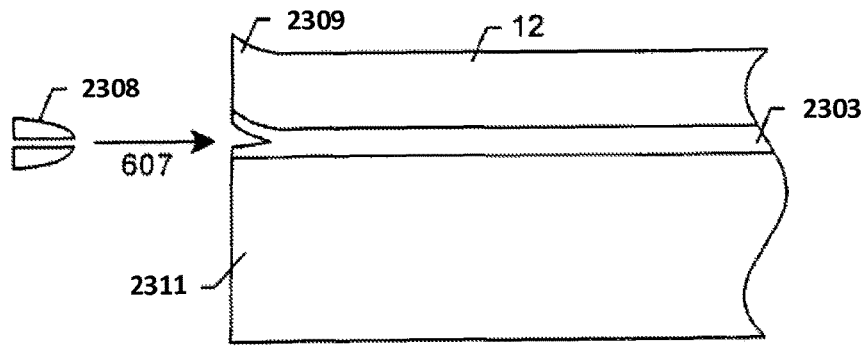
FIG. 23A
FIG. 23B
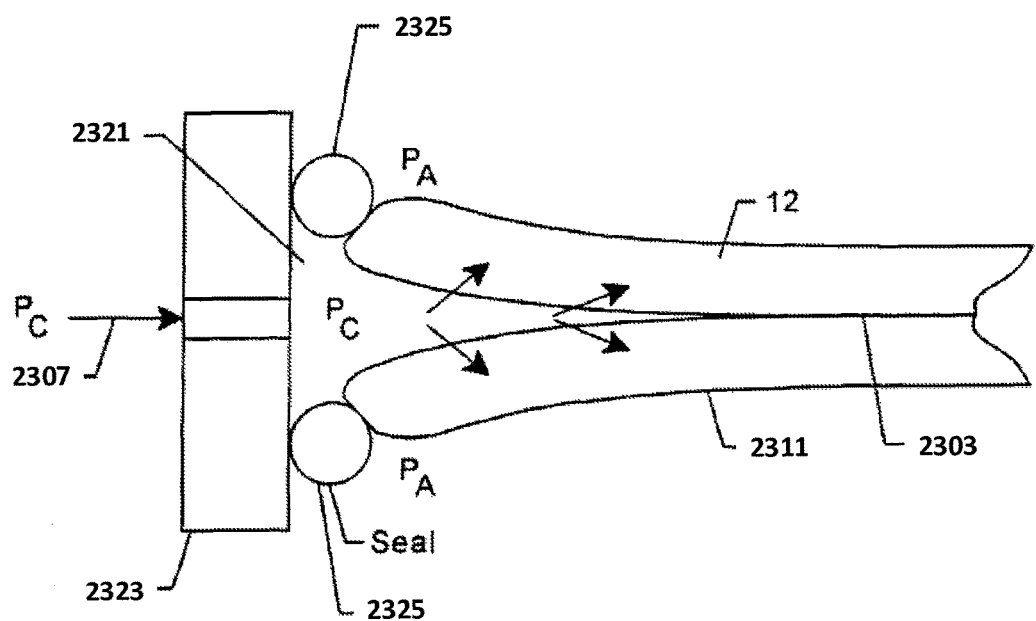

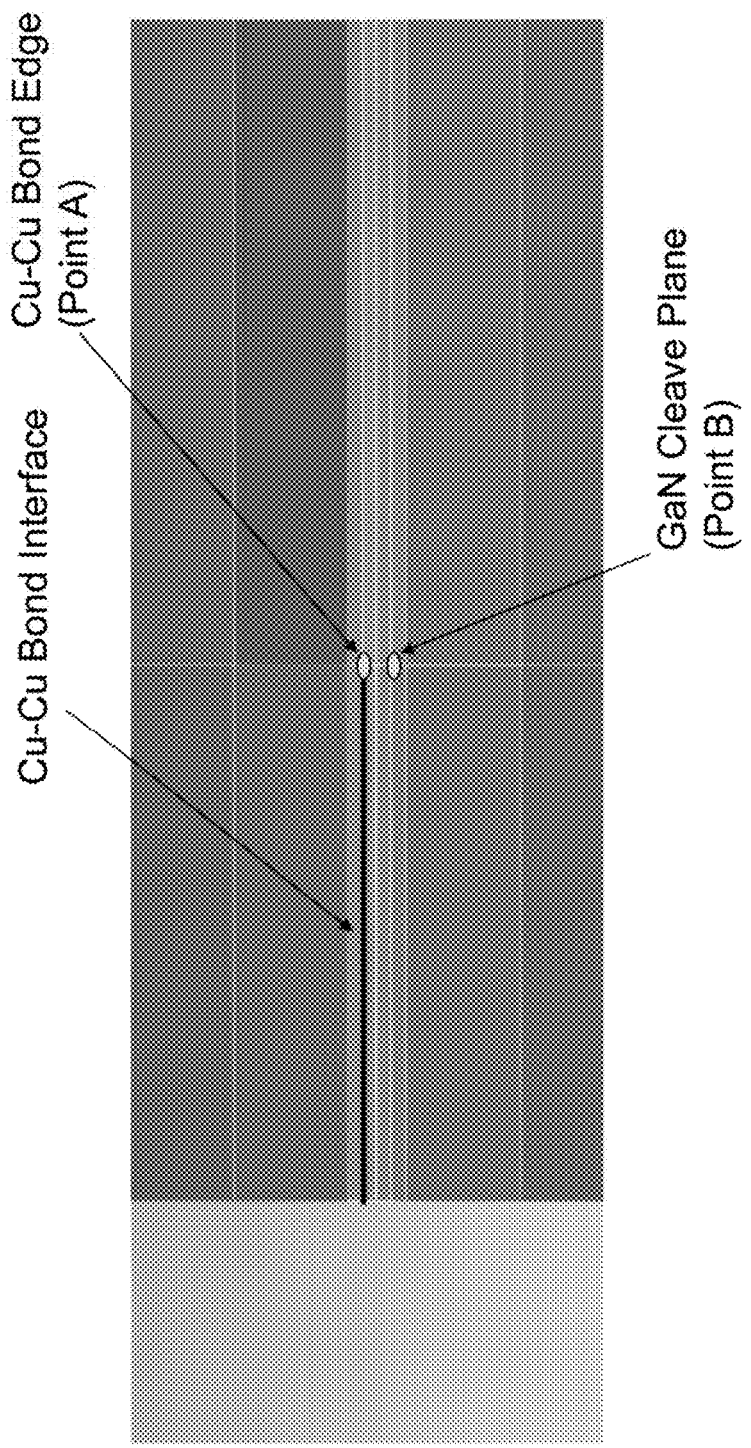
Figure 30: Initiation Configuration (no edge treatment)

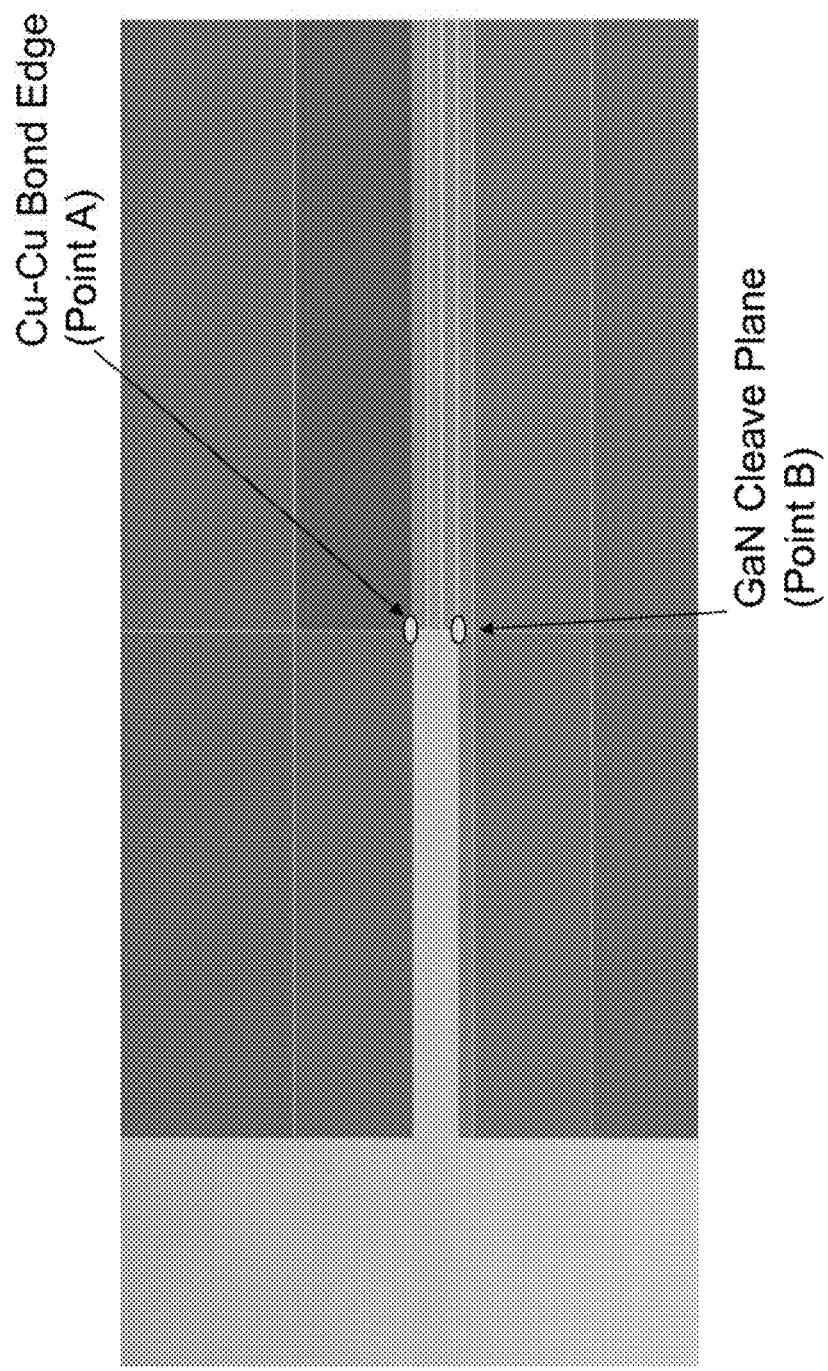
Figure 31: Initiation Configuration (with edge treatment)

Figure 32B
Patterned top surface
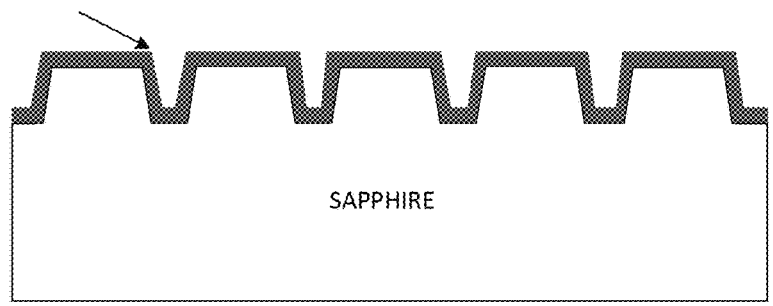
Deposit filler
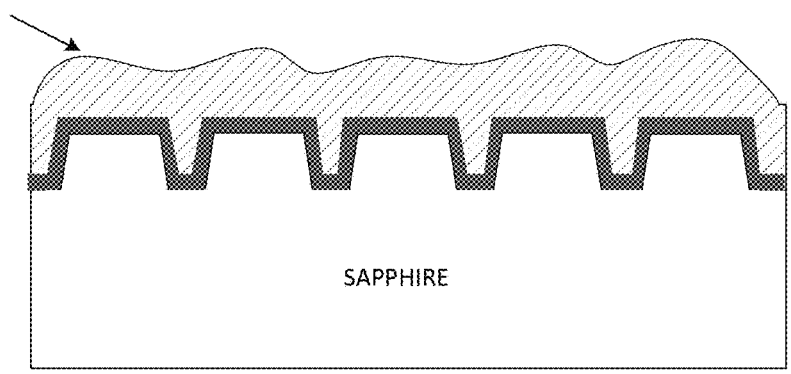
PLANARIZE
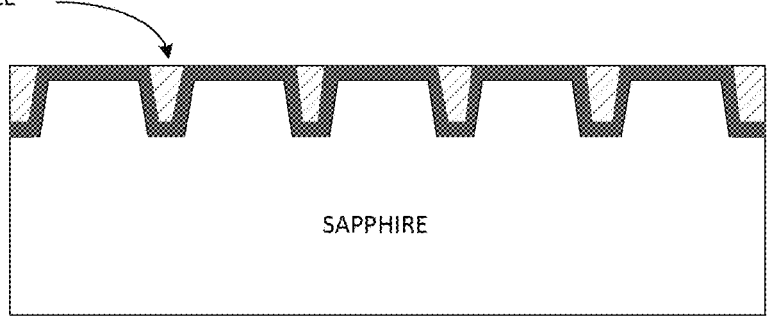
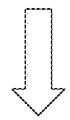
Use for bond.

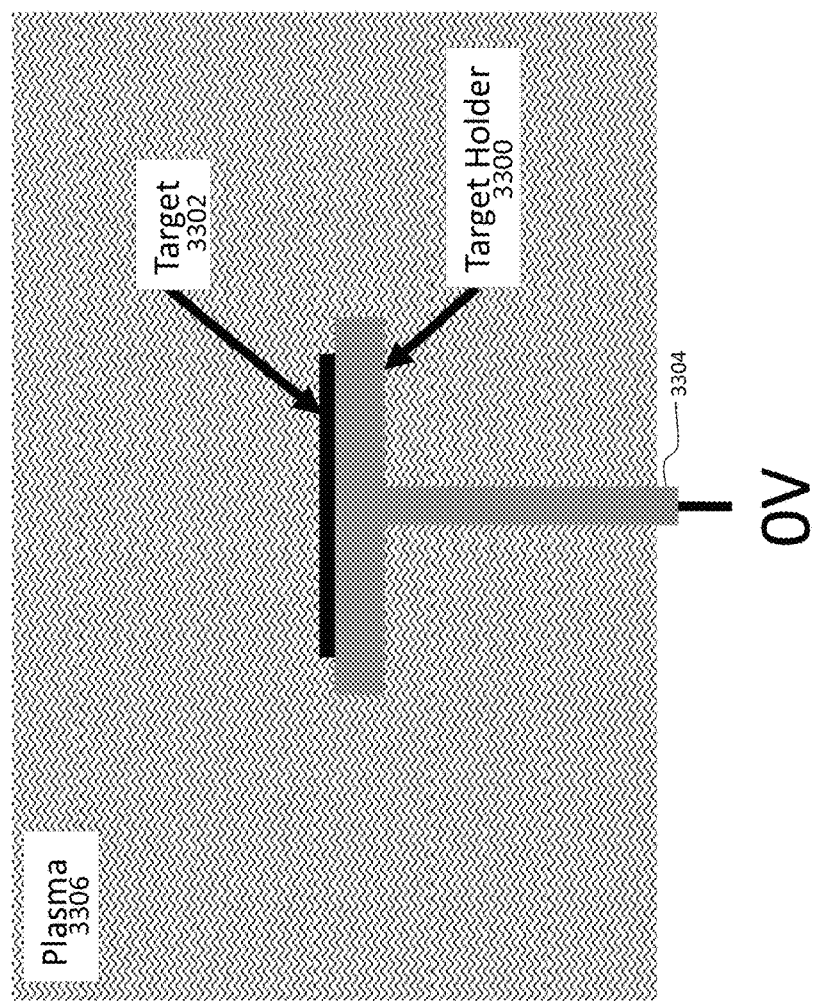
Figure 33: Plasma Immersion Ion Implantation Configuration (no pulse)

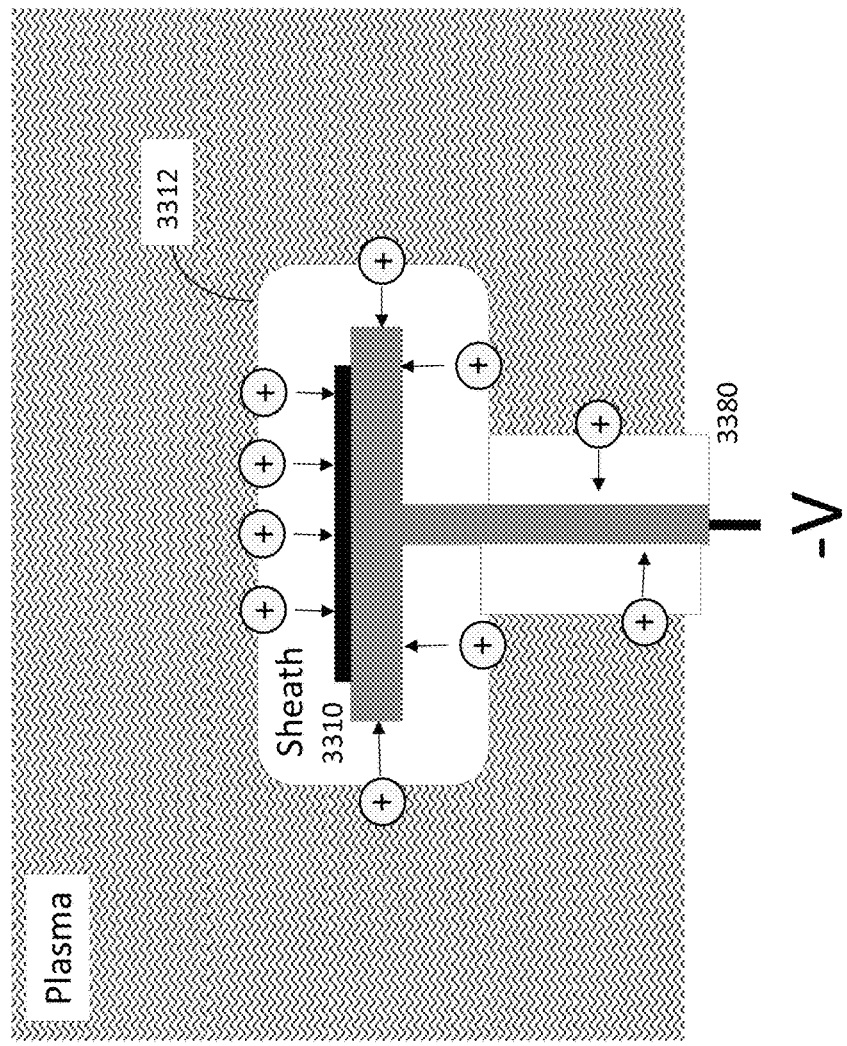
Figure 34: Plasma Immersion Ion Implantation Configuration (HV pulse)

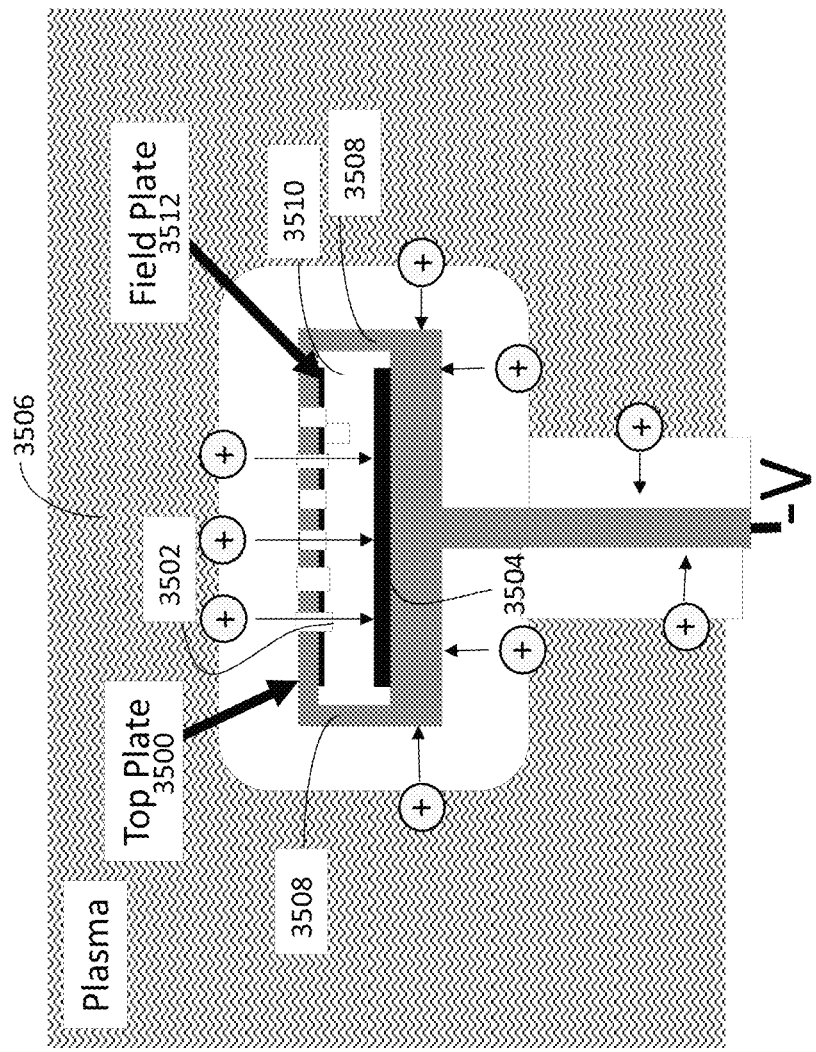
Figure 35: Drift-Mode Configuration (HV pulse)

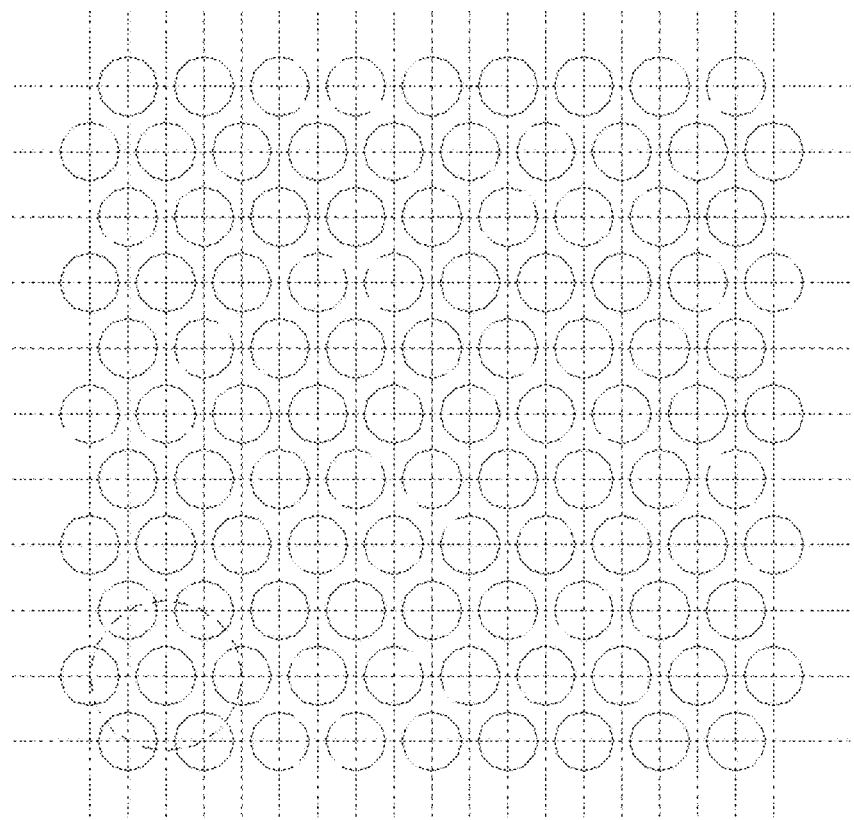
Figure 36: Close-Packed Hole Configuration

TECHNIQUES FOR FORMING OPTOELECTRONIC DEVICES

CROSS-REFERENCE TO RELATED APPLICATION

The instant nonprovisional patent application claims priority to U.S. Provisional Patent Application No. 61/753,364 filed Jan. 16, 2013 and incorporated by reference in its entirety herein for all purposes.

BACKGROUND

Embodiments of the present invention relate generally to techniques including a method and a structure for forming substrates using a layer transfer technique. Certain embodiments employ an accelerator process for the manufacture of semiconductor films in a variety of applications including optoelectronic devices such as light emitting diodes (LEDs) and semiconductor lasers. But it will be recognized that the invention has a wider range of applicability; it can also be applied to other types of applications such as for three-dimensional packaging of integrated semiconductor devices, photonic or photovoltaic devices, piezoelectronic devices, flat panel displays, microelectromechanical systems ("MEMS"), nano-technology structures, sensors, actuators, integrated circuits, biological and biomedical devices, and the like.

Certain embodiments may including methods and apparatuses for cleaving free standing films from material in bulk form, such as a single crystal GaN or SiC ingot. Such free standing films are useful as a template for the formation of an optoelectronic device such as an LED. But, it will be recognized that embodiments of the invention have a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

Semiconducting materials find many uses, for example in the formation of logic devices, solar cells, and increasingly, illumination. One type of semiconductor device that can be used for illumination is the high-brightness light emitting diode (HB-LED). In contrast with traditional incandescent or even fluorescent lighting technology, HB-LED's offer significant advantages in terms of reduced power consumption and reliability. Another type of semiconductor device that can be used for illumination is a laser. Lasers that operate based upon semiconductor principles are finding increasing adoption for use in displays and other applications.

Such optoelectronic devices rely upon materials exhibiting semiconductor properties such as type III/V materials such as gallium nitride (GaN). GaN is available in various degrees of crystalline order. However, these materials are often difficult to manufacture.

Additionally, materials such as these semiconducting materials suffer from material losses during conventional manufacturing called "kerf loss", where the sawing process eliminates as much as 40% and even up to 60% of the starting material from a grown boule and singulate the material into a wafer form factor. This is a highly inefficient method of preparing expensive semiconducting materials for optoelectronic applications.

In particular, conventional techniques for manufacturing single crystal semiconductor materials into electronic devices, typically involve the physical separation of thin single crystal layers of semiconductor materials, from an originally synthesized ingot or boule. One such a conventional manufacturing technique is inner diameter (ID) sawing.

The ID sawing technique employs a circular saw having a blade located on its inner diameter. The ingot is pushed through the center of the saw until a desired wafer thickness is on the other side of the saw. With the saw rotating, the saw is then raised or lowered to allow the blade to slice through the ingot. The ID sawing method offers a number of possible disadvantages.

One is that the saw must be of minimum thickness to be sufficiently strong to withstand the stress of the sawing action. However, an amount of material corresponding to this saw thickness (the kerf) is lost by this cutting. Use of even the thinnest saw blade that can reliably be used to saw the ingot, may result in losses of expensive, pure single crystal material to the kerf. For example, a typical saw blade kerf has a width of 300 µm, where an individual sliced wafer may have a width of only 400-500 µm. Use of the conventional wafer sawing technique can thus result in kerf losses of expensive, pure starting material amounting to as high as 60% of the entire ingot. Another disadvantage of the conventional ID sawing technique is that slices can only be separated one at a time, thus limiting throughput and elevating cost.

Partly in response to the limited throughput of sawing, the alternative conventional technique of wire sawing has been developed. In wire sawing, a network of rapidly moving parallel wires is provided. The side of an ingot is then contacted with the moving wires in an environment usually including oil and abrasives, resulting in simultaneous slicing of the wafer into a plurality of wafers. The advantages of this technique over ID sawing includes parallel sawing of the boule. While effective, conventional wire sawing also offers disadvantages, in particular a still significant kerf loss of about 50% attributable to the thickness of the wire, and possible contamination by exposure of the substrate to the oil and abrasives.

Moreover, layer-transfer can enable numerous thermal, electrical and optical characteristics desirable in a solid-state lighting device to be integrated within a growth substrate. Instead of requiring complex post-processing, such a structure would eliminate subsequent manufacturing steps, thus improving performance and lowering cost.

From the above, it is seen that techniques for forming suitable substrate materials of high quality and low cost are highly desired. Cost-effective and efficient techniques for the manufacture of semiconductor-based optoelectronic devices are also desirable.

SUMMARY

Embodiments relate to use of a particle accelerator beam to form thin films of material from a bulk substrate. In particular embodiments, a bulk substrate (e.g. donor substrate) having a top surface is exposed to a beam of accelerated particles. In certain embodiments, this bulk substrate may comprise GaN; in other embodiments this bulk substrate may comprise Si, SiC, or other materials. Then, a thin film or wafer of material is separated from the bulk substrate by performing a controlled cleaving process along a cleave region formed by particles implanted from the beam. In certain embodiments this separated material is incorporated directly into an optoelectronic device, for example a GaN film cleaved from GaN bulk material. In some embodiments, this separated material may be employed as a template for further growth of semiconductor materials (e.g. GaN) that are useful for optoelectronic devices.

BRIEF DESCRIPTION OF THE DRAWINGS

FIGS. 12-22 are simplified diagrams illustrating a controlled cleaving technique.

FIG. 23A is a simplified diagram illustrating a controlled cleaving technique using dynamic pressure embodied as a high-pressure jet of fluid or gas to separate a thin film of material from a donor wafer.

FIG. 23B is a simplified diagram illustrating a controlled cleaving technique using static pressure to separate a thin film of material from a donor wafer according to an embodiment.

FIGS. 30 and 31 show the non-cut and cut configurations respectively where Double-Cantilevered Cleave (DCB) mechanical loading is applied and the cleave plane energy is calculated.

FIG. 32B shows an embodiment of the process sequence where the top planarized layer can contain electrically conductive islands.

FIG. 33 is a simplified view of one plasma immersion ion implantation (PIII) configuration according to an embodiment.

FIG. 34 shows a simplified view of the embodiment of FIG. 33 with a pulsed voltage.

FIG. 35 shows a simplified view of an embodiment of a PIII drift-mode configuration.

FIG. 36 shows a close-packed hole configuration according to an embodiment.

DETAILED DESCRIPTION

Figure 1:
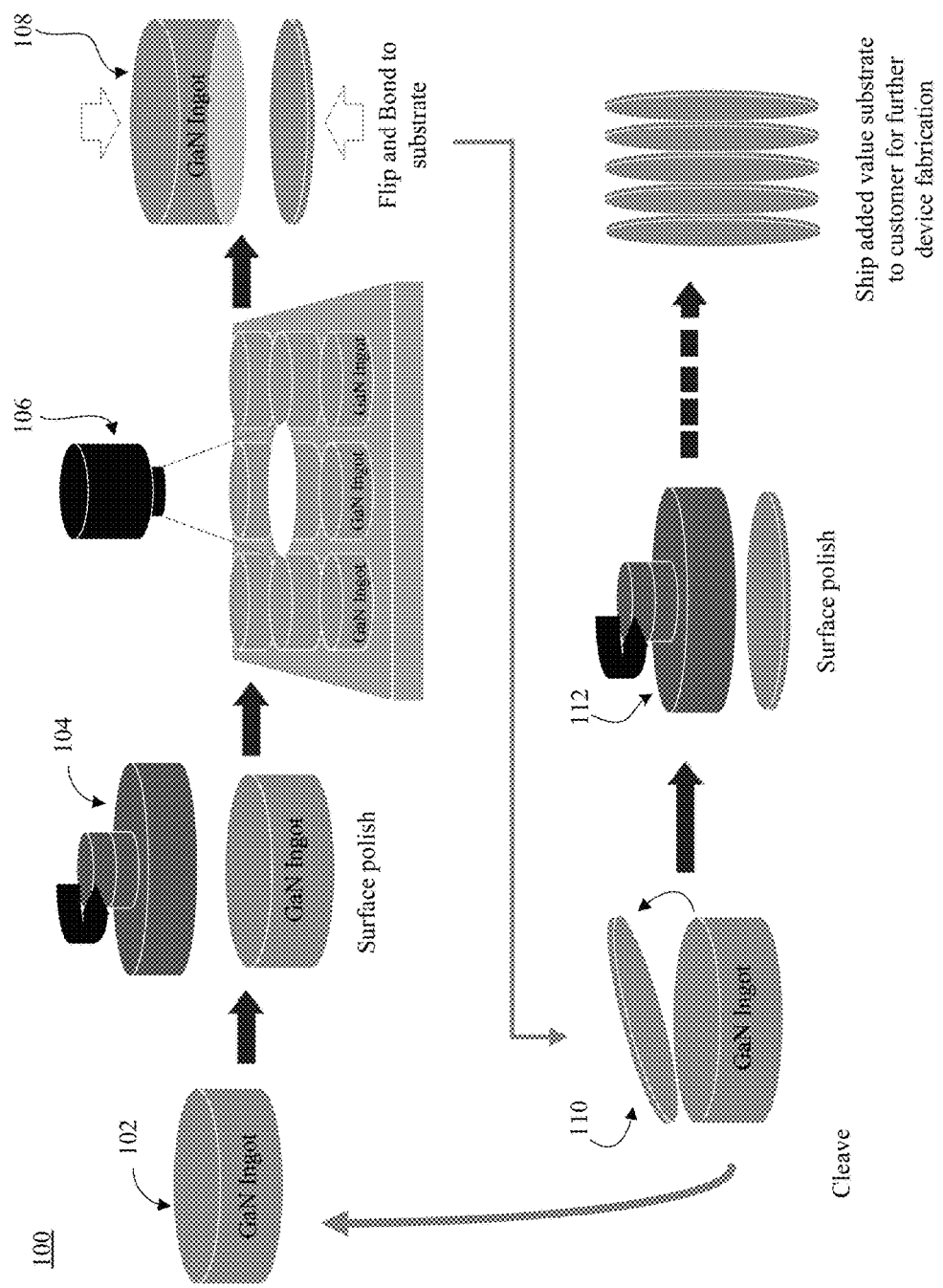
FIG. 1 is a simplified process flow illustrating a method using a layer transfer process according to an embodiment of the present invention.

According to embodiments of the present invention, techniques including a method for forming substrates suitable for opto-electronic applications are provided. More particularly, embodiments according to the present invention provide a method to form a layer of material from a semiconductor material. In a specific embodiment, the layer of material is provided using a plurality of high energy particles to cause a formation of a cleave plane in the semiconductor substrate. Methods according to embodiments of the invention can be used in a variety of applications, including but not limited to optoelectronic devices, semiconductor device packaging, photovoltaic cells, MEMS devices, and others.

According to certain embodiments of the present invention, a free standing film may be separated from a bulk material. In one embodiment, a free standing layer of semiconductor material such as single crystal GaN, having a thickness of 10 μm or greater, may be cleaved from a bulk ingot utilizing high energy implantation. Cleaving the ingot in this manner substantially reduces the amount of semiconductor material that is otherwise lost to the kerf in a conventional blade cutting process. In addition to enhancing the efficiency of the cleave action, managing parameters such as ion dose and temperature profile is also important to limit and control the radiation damage to the material that is separated. The resulting cleaved free standing film may be particularly suited for use in illumination, for example LEDs or laser devices.

For purposes of the following disclosure, a "free standing film" or "free standing layer" is defined as a film of material that can maintain its structural integrity (i.e. not crumble or break apart), without being in contact with a supporting member such as a handle or transfer substrate. Typically, very thin films (for example GaN films thinner than about 5-10 μm) are unable to be handled without breaking Conventionally, such thin films are manipulated using a supporting structure, which may also be needed to create the thin film in the first place. Handling of thicker films (i.e. GaN films having a thickness of between 10-50 μm) may be facilitated by the use of a support, but such a support is not mandatory. Accordingly embodiments of the present invention relate the fabrication of free standing films having a thickness of greater than 10 μm. Also for purposes of the following disclosure, the terms "substrate" and "tile" are employed interchangeably.

Embodiments in accordance with the present invention are not limited to forming free standing films. Alternative embodiments may involve the formation of films supported by a substrate. Moreover, irrespective of whether the films used in various applications are truly free-standing or supported with handling or transfer substrates during processing, processed devices are usually mounted onto a mechanical interface such as a metal base for the final application as an integral part of a lighting module.

Also for purposes of the following disclosure, "bulk material" refers to a material present in bulk form. Examples of such bulk material include a substantially circular ingot or boule of single crystal GaN as grown, or a grown single crystal GaN ingot having sides shaved to exhibit other than a substantially circular cross-sectional profile. Still other examples of bulk materials are described below.

In a specific embodiment, the present method may be applied successively to cleave multiple slices of free standing layers from a single ingot, e.g., GaN boule or a thickness of GaN mounted onto a suitable substrate such as a metal base substrate. That is, the method can be repeated to successively cleave slices (similar to cutting slices of bread from a baked loaf) according to a specific embodiment. Of course, there can be other variations, modifications, and alternatives.

FIG. 1 shows one example of a process flow 100 according to an embodiment. In a first step 102 of this a process flow, a donor substrate comprising GaN in bulk form as an ingot, is provided. While in this particular embodiment the donor substrate comprises GaN, this is not required. A donor substrate according to various embodiments could be a silicon wafer, a germanium wafer, silicon germanium materials, silicon carbide bearing materials, Group III/V compounds, any combination of these, and others.

In an optional step 104, the surface of the GaN ingot may be polished, for example when the ingot has been reused from a previous layer transfer process. In a step 106, the GaN ingot is subjected to implantation with accelerated particles, to form a cleave region. In certain embodiments, this cleave region may lie at a depth of between about 10-20 um underneath the surface of the bulk material. Formation of a cleave region depends upon such factors as the target material, the crystal orientation of the target material, the nature of the implanted particle(s), the dose, energy, and temperature of implantation, and the direction of implantation. Such implantation is discussed further in detail below, and may share one or more characteristics described in detail in connection with the following patent applications, all of which are incorporated by reference in their entireties herein: U.S. patent application Ser. No. 12/789,361; U.S. patent application Ser. No. 12/730,113; U.S. patent application Ser. No. 11/935,197; U.S. patent application Ser. No. 11/936,582; U.S. patent application Ser. No. 12/019,886; U.S. patent application Ser. No. 12/244,687; U.S. patent application Ser. No. 11/685,686; U.S. patent application Ser. No. 11/784,524; U.S. patent application Ser. No. 11/852,088.

In an optional next step 108, the surface of the implanted bulk material is bonded to a substrate, which may be a handle substrate. This bonding may be temporary in nature, or may be more permanent. The bonding may employ techniques including but not limited to electrostatic bonding, plasma bonding, bonding based upon interatomic forces arising from surface roughness, adhesives, or others. One example of a possible bonding technique which may be used, is thermo-compression bonding. Another example of a possible bonding technique is plasma activated bonding (PAB).

Releasable bonding may be accomplished utilizing one or more various techniques, in combination. One such technique is the use of a thin intervening layer (for example silicon oxide), that is later sacrificed to effect separation. Releasable bonding may also be achieved based upon certain roughness regimes, for example as disclosed by Cui et al. in "The Effect of Surface Roughness on Direct Wafer Bonding", Journal of Applied Physics, Vol. 85, No. 10, pp. 7448-7454 (1999), which is incorporated by reference in its entirety herein for all purposes.

The handle substrate can be glass, quartz, polymeric, metal or metal alloy, or other composites, and the like. In other embodiments, the handle substrate can be any homogeneous, graded, or multilayered material, or any combination of these. That is, the handle substrate can be made of almost any monocrystalline, polycrystalline, or even amorphous type substrate. The substrate can be made of SiC. Additionally, the substrate can be made of III/V materials such as gallium arsenide, gallium nitride (GaN), and others. Additionally, the handle substrate can be metal or metal alloy, silicon carbide, germanium, silicon, glass or quartz combinations, plastics, and polymers.

A backing substrate may be provided to add rigidity to handle substrate structure. Preferably, the backing substrate has a thickness and material that is adequate to provide an effective deflection characteristic of a multilayered structure composed of at least the backing substrate and handle substrates to be suitable for a thickness of GaN bearing material from the donor substrate to be transferred onto the face of the handle substrate. As merely an example, the backing substrate can be a silicon wafer for a quartz handle substrate. Other types of materials and certain thicknesses such as plastic, metal, glass, quartz, composites, and the like can be used to provide the rigidity to the combined backing and handle substrate structures. Of course, one of ordinary skill in the art would recognize other variations, modifications, and alternatives.

In a next step 110, thickness of material of the implanted surface of the bulk material, is cleaved from the bulk material using the cleave region. In certain embodiments using relatively high H+ proton implant energies in the MeV range, this produces a detached layer of semiconductor material having a thickness of between about 10-20 um. In other embodiments using bonded layer-transfer, thinner cleaved layers of 0.05-1 um may be used. For producing GaN cleaved films of these thicknesses, lower H+ proton implant energies ranging from approximately 5-180 keV may be used. For example, 40 keV H+ proton energy would produce a GaN cleaved film of approximately 0.25 um in thickness. It is understood that $H_2+$ can also be utilized for this implant step. In such cases, the dose rate would be doubled while the effective H+ energy would be halved. For example, an 80 keV $H_2+$ implant could have the same detached layer thickness (range) than a 40 keV H+ implant. However the dose rate would be double the H+ dose rate for the same implant current.

The cleaving may take place utilizing the application of various forms of energy, and may exhibit one or more of the characteristics disclosed in any of the patent applications incorporated by reference above. In a particular embodiment, this cleaving may take place utilizing a compressional force applied in the form of a static gas in a high pressure chamber containing the implanted bulk material. The application of energy in various forms to accomplish cleaving according to particular embodiments is also described in the U.S. Pat. No. 6,013,563 incorporated by reference herein for all purposes.

As described in connection with the following figures, and in further detail below, a cleaving process may itself comprise one or more steps. FIGS. 1A-D show simplified views of a controlled cleaving process according to certain embodiments.

Figure 1A:
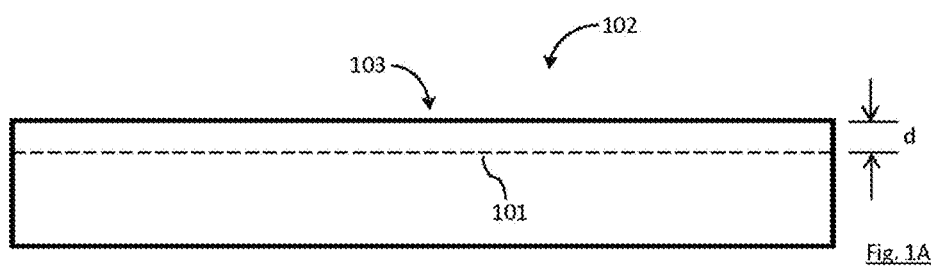
FIGS. 1A-D show steps of controlled cleaving according to various embodiments.

FIG. 1A shows the implanted bulk material 102 prior to cleaving, which in a particular embodiment may be GaN. The cleave region 101 lies at a depth d below the surface 103.

Figure 1B:
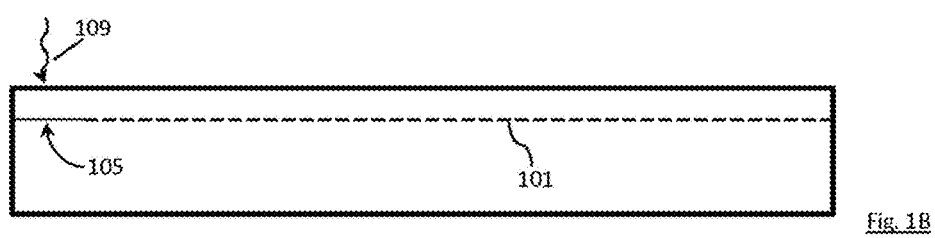

FIG. 1B shows a first cleaving step, wherein application of energy to a cleave initiation region 105, results in the initiation of cleaving. An example of such a cleave initiation step is the application of energy in the form of a photon beam 109, for example from a laser. This delivered energy causes initiation of cleaving as shown.

Figure 1C:
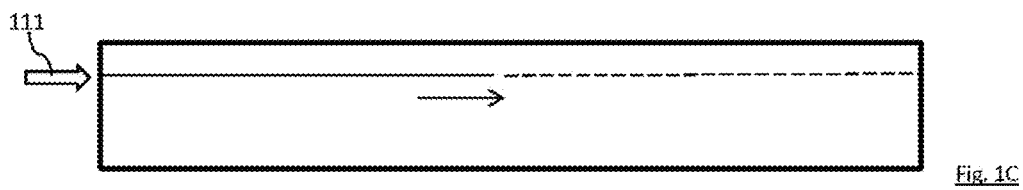

FIG. 1C shows a second cleaving step, wherein application of additional energy 111 results in propagation of the cleaving in the cleave region. Continued propagation of the cleaving frees a thickness of material from the bulk material.

Figure 1D:
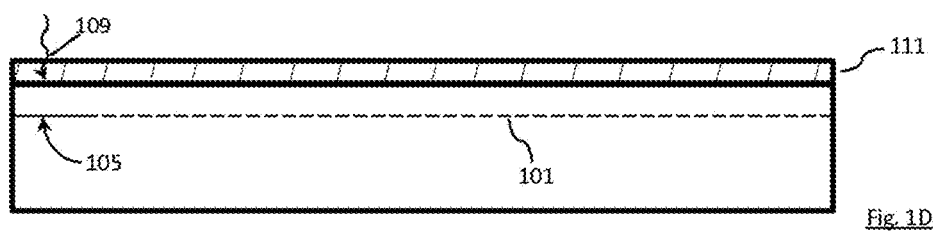

It is noted that in certain applications, the bulk material may exhibit substantial transparency to the transmission of optical energy. Thus in order to deliver energy to the cleave initiation region from an incident optical beam, as shown in FIG. 1D a thin overlying layer 113 that absorbs the incident photons, may be provided. Absorption by this layer 113 will create heat, that in turn is transmitted through the bulk material to the cleave initiation region. This light absorbing material can be any material, and in certain embodiments may comprise SiC. In some embodiments, the light absorbing material could be removed once the desired cleave initiation has occurred. In certain embodiments, the light absorbing material can be retained during one or more additional processing steps described below.

While the above has described application of energy in the form of an incident optical beam to accomplish cleaving, this is not necessarily required. Alternative embodiments could apply other forms of energy for cleaving purposes, including but not limited to global or local heating of the substrate, in whole or in part from heat lamps, electron beams, or even thermal energy associated with implantation of particles.

Returning to FIG. 1, in a next step 112 of the process, the exposed surface of the cleaved material on the substrate, is polished to reduce roughness resulting from any cleaving process. The combination of the polished cleaved material and the underlying substrate may then be transferred as an added value material for further processing and incorporation into an optoelectronic device.

While the above description references surface treatment utilizing polishing, this is not required in all embodiments, and alternatives could employ polishing in combination with other surface treatment, or even surface treatment that does not involve polishing. For example, according to some embodiments the surface treatment could include an anneal. In particular embodiments the anneal could take place in the presence of an overlying cap layer, for example comprising AlN or SiO2. The annealing could be performed in a furnace (e.g. typically where the cap layer is present), or could be performed within a MOCVD chamber (e.g. where no cap layer is present).

Surface treatment (e.g. comprising polishing, annealing, and/or cap layer formation) could also include etching processes. Examples of etching processes can include but are not limited to plasma etching, and/or chemical etching. Chemical assisted ion beam etching (CAIBE) is one example of a type of chemical etching. Wet chemical etching is another example of chemical etching.

The above sequence of steps provide a method according to certain embodiments of the present invention. Other alternatives can also be provided where steps may be added, one or more steps may be removed, or one or more steps may be provided in a different sequence. For example in an alternative embodiment, substrate bonding could take place after the cleaving, with the cleaving resulting in a free standing film in turn bonded to the substrate.

Figure 2:
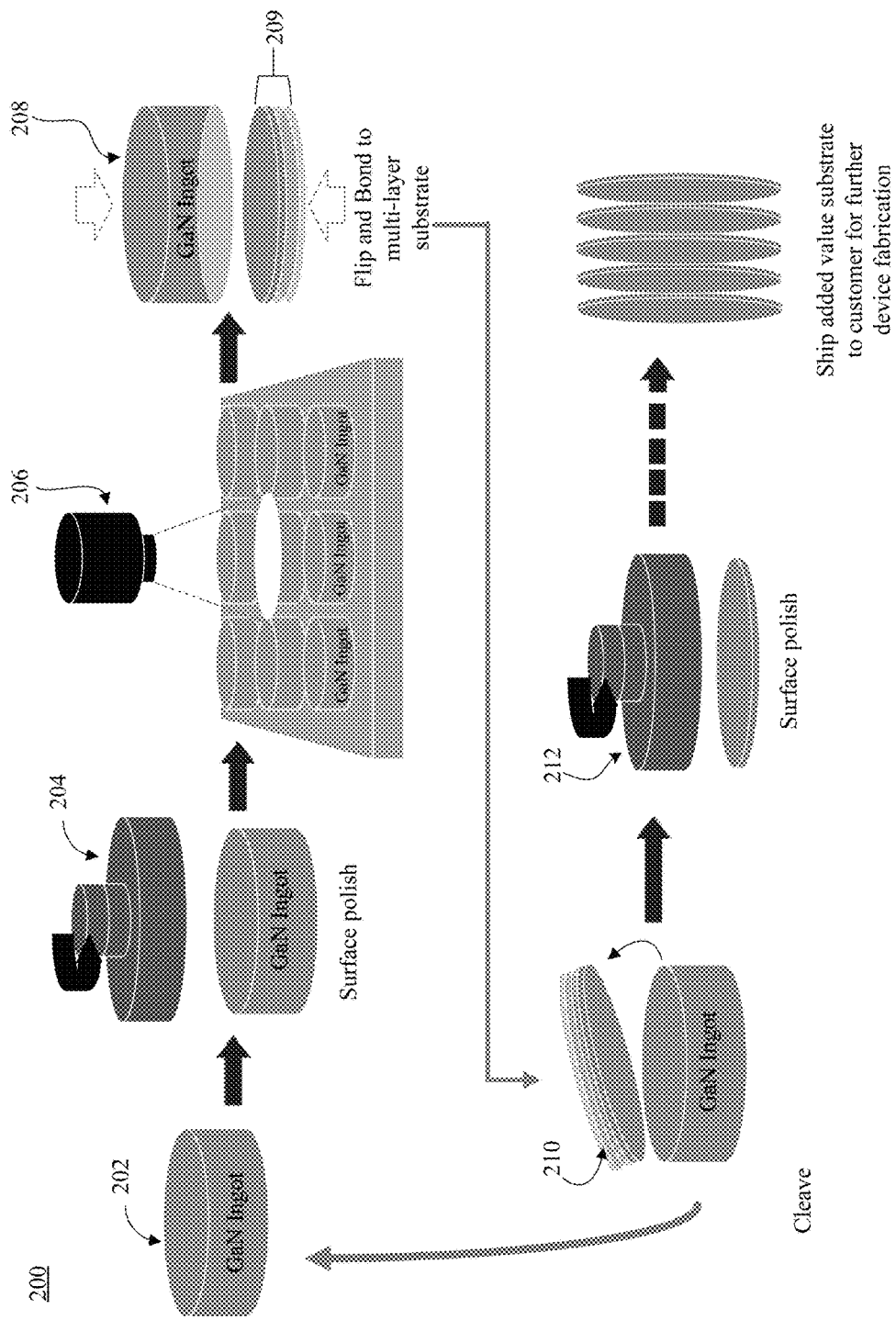
FIG. 2 is a simplified process flow illustrating an alternative embodiment.

And while the embodiment of FIG. 1 shows cleaving of a bulk material (here GaN) onto a monolithic substrate, this is not required and other embodiments could involve cleaving onto multi-layer substrates. For example, FIG. 2 shows an example of a process flow 200 according to another embodiment. In a first step 202 of this a process flow, a single crystal GaN in bulk form as a GaN ingot, is provided. This ingot may exhibit one of the typical crystalline orientations of single crystal GaN, for example (1111).

Following surface polish (204) and implant (206) steps, in a next step 208, modified additional material may be bonded to a multi-layer substrate 209, either temporarily or permanently. In certain embodiments, this substrate may comprise a material having a coefficient of thermal expansion (CTE) compatible with conditions for creating more of the additional material. In particular, linear coefficient of thermal expansion of GaN ($\alpha_{GaN}$) is about $5.5 \times 10^{-6}$ K$^{-1}$.

Examples of such materials having CTE compatibility with GaN may include but are not limited to, metal or metal alloys. Possible suitable metals may include Molybdenum or Tungsten, while candidate metal alloys may comprise molybdenum, such as copper molybdenum alloys or molybdenum tungsten alloys.

Subsequent steps in the process flow of FIG. 2 correspond to similar steps in FIG. 1, except that a substrate comprising multiple layers is used.

Products may be built on a CTE-matched metal substrate (e.g. a Molybdenum alloy), where various layers may be incorporated in order to achieve desired benefits to an end-user or manufacturer. A basic layer structure for HB-LED applications is shown in FIG. 3A.

Figures 3A, 3B:
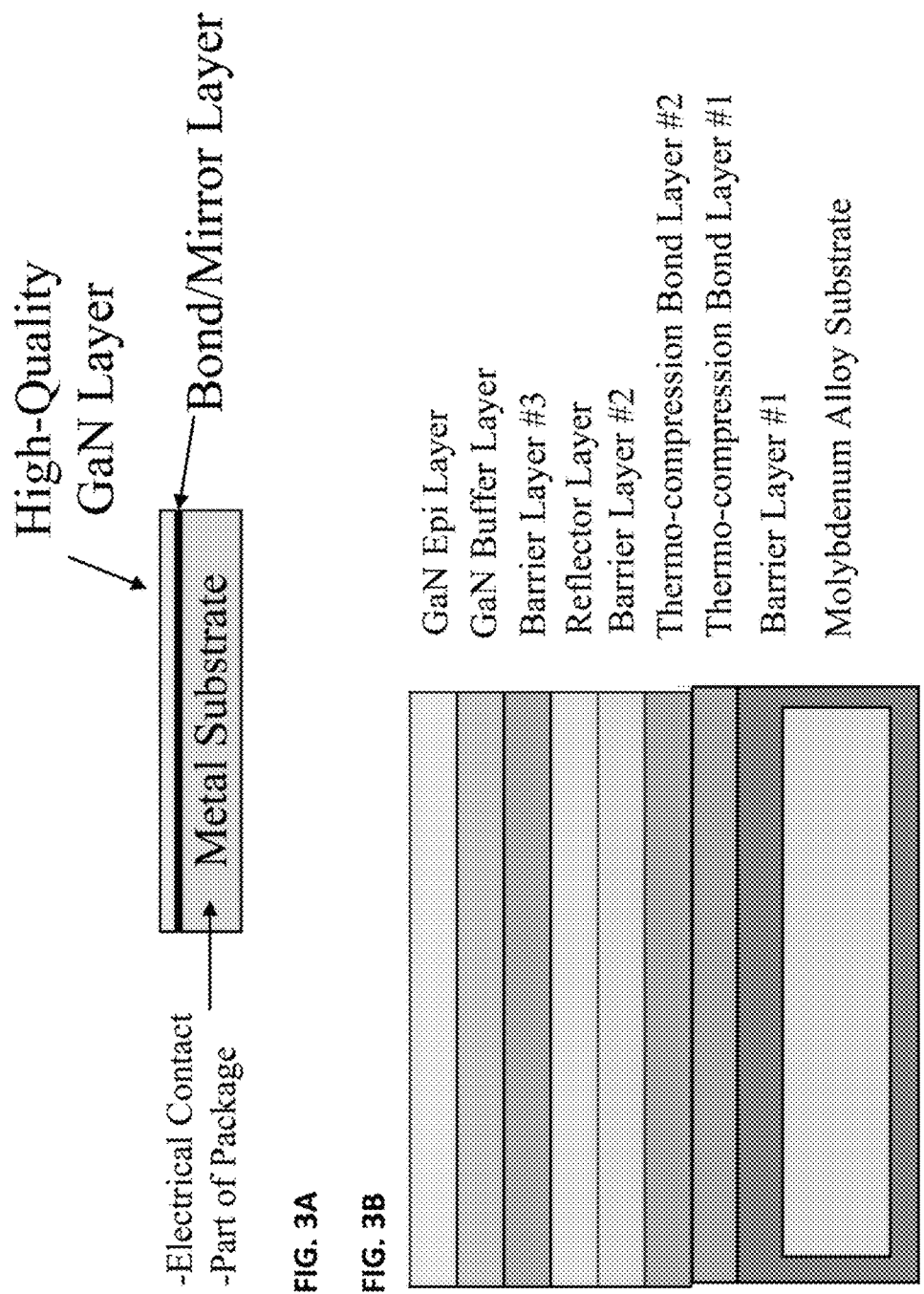
FIG. 3A is a simplified view showing an embodiment of a multi-layer substrate structure.
FIG. 3B is a detailed view of an embodiment of a multi-layer substrate structure for use in HB-LED applications.

FIG. 3B shows an enlarged cross-sectional view of one particular embodiment of a multi-layer substrate which may be used for HB-LED applications. Examples of the various layers which may be used include barrier layers, thermocompression bond layers, a mirror layer, and the GaN buffer and device growth layers. Barrier layers are layers that protect the integrated films from contamination, inter-mixing and other deleterious effects during thermal processing such as the GaN device layer formation step(s). Such layers can include AlN, HfN, TiB2, Pt, Ta among other well known barrier layer materials. Other such layers serving as encapsulation layers may also be desirable to enhance surface properties such as porosity and roughness. For example, a nickel layer (polished or not depending on the specific application) may serve as an encapsulating layer on a Molybdenum alloy substrate to provide good bond yield and uniform surface characteristics. Other coating layers can include but are not limited to nickel-gold alloys, ruthenium, chromium or silver.

Subsequent steps to grow the devices from the GaN layer (e.g. metal-organic chemical vapor deposition (MOCVD) of GaN) may occur at roughly 1000° C. for 2-3 hours. Accordingly, the use of appropriate buffer and/or barrier layers may ensure thermal survivability of desired features.

Together, the layers form an engineered GaN growth substrate, and may achieve one or more of the following possible features and potential benefits for the HB-LED device manufacturers.

One possible benefit is a reduction in lattice mismatch. In particular, this benefit may be achieved by using a thin, high-quality GaN layer for homoepitaxial growth.

Another possible benefit are a low incidence of threading dislocation density (TDD)/Defects. According to embodiments, these defects may be reduced to at or below Free Standing GaN levels, using a thin, high-quality GaN layer.

Still another possible benefit is a reduction in CTE-Mismatch. Use of a CTE-matched metal substrate (e.g. Molybdenum alloy) engineered to match the GaN layer through the epitaxial growth temperature, may thereby eliminate CTE mismatch induced layer stresses, cracks and defects.

Yet another possible benefit is the realization of high electrical and thermal conductivity. The use of a metal substrate and thermally and electrically conductive internal layers, may allow the growth substrate to be used as the mounting substrate for the HB-LED package/luminaire in the final vertical LED structure. High thermal and electrical conductivity allows higher External Quantum Efficiency (EQE), higher Wall Plug Efficiency (WPE), and may eliminate certain back-end manufacturing steps such as laser lift-off. As compared to Sapphire, proposed embodiments may allow vertical LED contact structure without device lift-off and bonding, and higher thermal conductivity by a factor approaching 10×. In certain embodiments, the desired thermal conductivity of the multi-stack substrate may exceed 5-30 W/cm²-K, and electrical resistance of the multi-stack substrate (related to the electrical conductivity) may be less than $1 \times 10^{-4}$ Ohm-cm².

Embodiments may offer a possible benefit of enhanced optical efficiency. In particular, the integration of an internal reflector under the GaN growth film, may allow the use of the substrate within the final HB-LED package, with further savings in back-end manufacturing steps such as mirror layer growth and lift-off/bond steps. This is illustrated generally in connection with FIG. 3D. The reflection layer can comprise a metal such as silver, gold, aluminum. Use of a thin silver layer, for example, could support a reflectivity exceeding 75% in the 400-500 nm spectral range, which may be a desirable feature to achieve high external quantum efficiency.

The reflection layer can comprise a dielectric layer stack. Such a dielectric layer stack may be made electrical conductive, in a manner that balances conductivity with reflective properties. Examples of parameters which can be controlled to form a dielectric layer stack exhibiting the desired properties can include but are not limited to, a number of layers in the stack, a thickness of layers in the stack, specific materials included in the stack, and/or the presence of dopant(s).

Still another possible benefit is the ability to use a smaller device size. As discussed below, embodiments may offer a low droop (see FIG. 3D), and thus efficient devices can be operated at higher current density. With up to 10× or even more devices able to be made on a substrate, epitaxial and packaging costs can be substantially lowered.

Figure 3C:
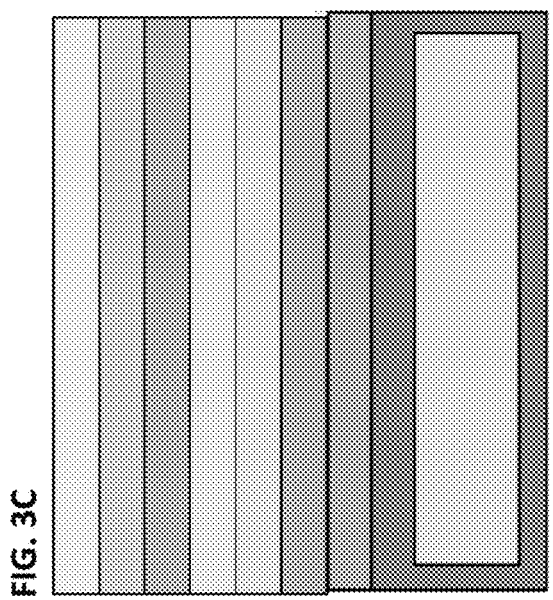
FIG. 3C is a detailed view of an embodiment of a multi-layer substrate structure for use in GaN electronic applications.

Embodiments may also be employed for GaN-based electronic devices. In such embodiments, the layers can be modified with a thermally conductive, electrically insulating intervening layer below the GaN device layer. In a particular embodiment, the integrated mirror layer of an LED embodiment (e.g. FIG. 3A) could be substituted with a thin (e.g. 20-50 um) insulating layer that would allow good GaN electronic device operation but also allow good thermal heat transfer. FIG. 3C shows an example of a substrate structure for this type of configuration. Such an intervening layer can be a material having good thermal conductivity and high electrical resistivity. Depending on the desired performance and cost targets, materials such as AlN (Aluminum Nitride) and Sapphire can be suitable.

One key application of the layer-transfer technology, may be to fabricate a functionally equivalent substrate to a free-standing GaN wafer for HB-LED and laser diode device manufacturing. Possible commercial advantages achieved in using free-standing GaN may include but are not limited to (i) better HB-LED performance (up to 100% higher in lumens/watt) and (ii) lower cost of epitaxial device layer manufacturing due to 30-50% less epitaxial growth chamber time by the elimination of graded buffers. In addition, the more efficient device offers substantial savings in packaging as well as competitive differentiation.

The use of conventional free-standing GaN substrates in device manufacturing is currently limited by cost and size limitation (e.g. 2" and 4" diameters presently). Both of these limitations are considered fundamental and strongly linked to the present methods of manufacturing GaN crystals by hydride vapor phase epitaxy (HVPE) or ammonothermal (Ga or GaN in supercritical ammonia/mineralizer) growth approaches.

HVPE and ammonothermal growth methods are slow and costly. Higher quality GaN usually necessitates less than 100-200 microns per hour using HVPE Ammonothermal growth may be slower, but with somewhat better crystal quality.

As the GaN bulk crystal is grown conventionally, defects such as dislocations generally work themselves out of the crystal by edge termination. This strongly ties the crystal diameter to the rate of dislocation reduction, and hence the HVPE and ammonothermal growth methods are generally limited to small crystal diameters for making high-quality GaN. Defect levels achievable on commercially available bulk or free-standing GaN (FS-GaN) 2" substrates are about $10^4$-$10^6$ defects/cm².

Because of the slow growth rate and use of wiresaws to fabricate these substrates, FS-GaN prices are currently in the $1,500-$3,000 (2" wafer) and $4,000-$8,000 (4" wafer). Because of the high cost of these substrates, their use is limited to R&D (High-Electron Mobility Transistor (HEMT) and optoelectronic) as well as blue/UV laser diode manufacturing.

Figure 3D:
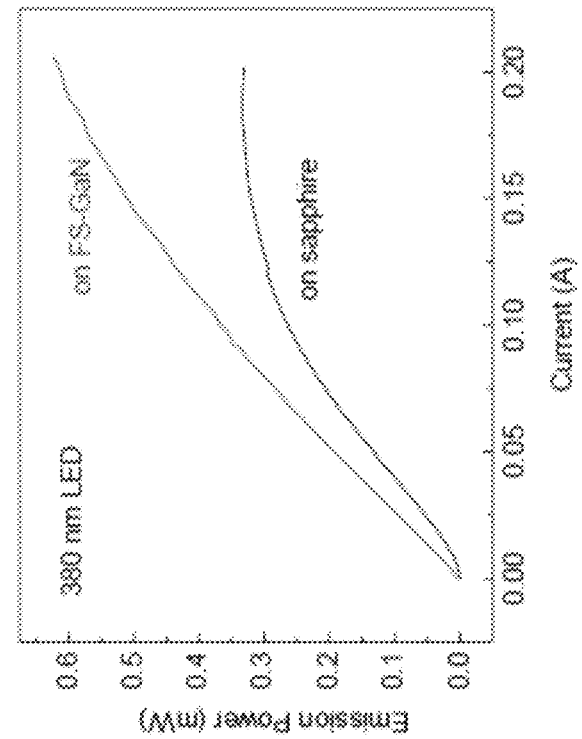
FIG. 3D plots LED emission power versus current as a comparison between GaN and sapphire based epitaxial growth seed material.

Although HB-LED device performance has been shown to improve as much as 100% using these higher quality substrates by eliminating the "droop effect", their high cost and limitation to small wafer diameters has prohibited their use. FIG. 3D shows the difference of test emission power as a function of drive current for equivalent devices made on a FS-GaN and GaN-on-sapphire substrates. The use of high-quality GaN as a growth medium reduces or eliminates device "droop" (brightness efficiency drops with increasing current), a parasitic device characteristic that increases device area to achieve higher lumens/W efficiency and control areal power dissipation. The tailing off or droop of the emission power limits efficiency to about 100-120 lumens/watt for sapphire substrate-based devices but FS-GaN substrate HB-LED devices have been shown to yield over 200 lumens/watt.

This low-droop translates to an ability to increase the current density that in turn will lead to as much as a 10× reduction in the size of HB-LED devices fabricated on substrates utilizing high-quality GaN material according to embodiments.

Figure 3E:
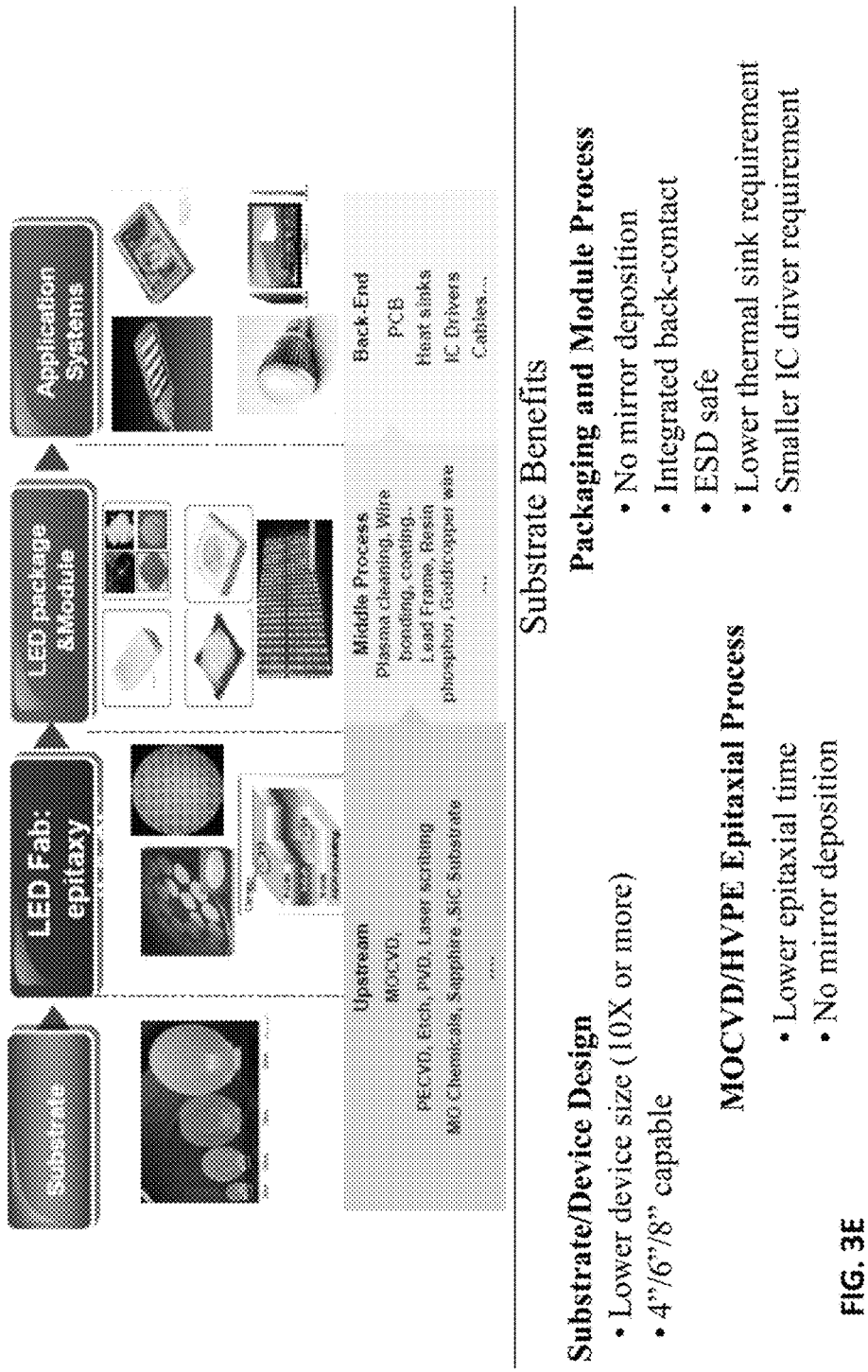
FIG. 3E presents an overview showing stages of an LED fabrication process.
Figure 4:
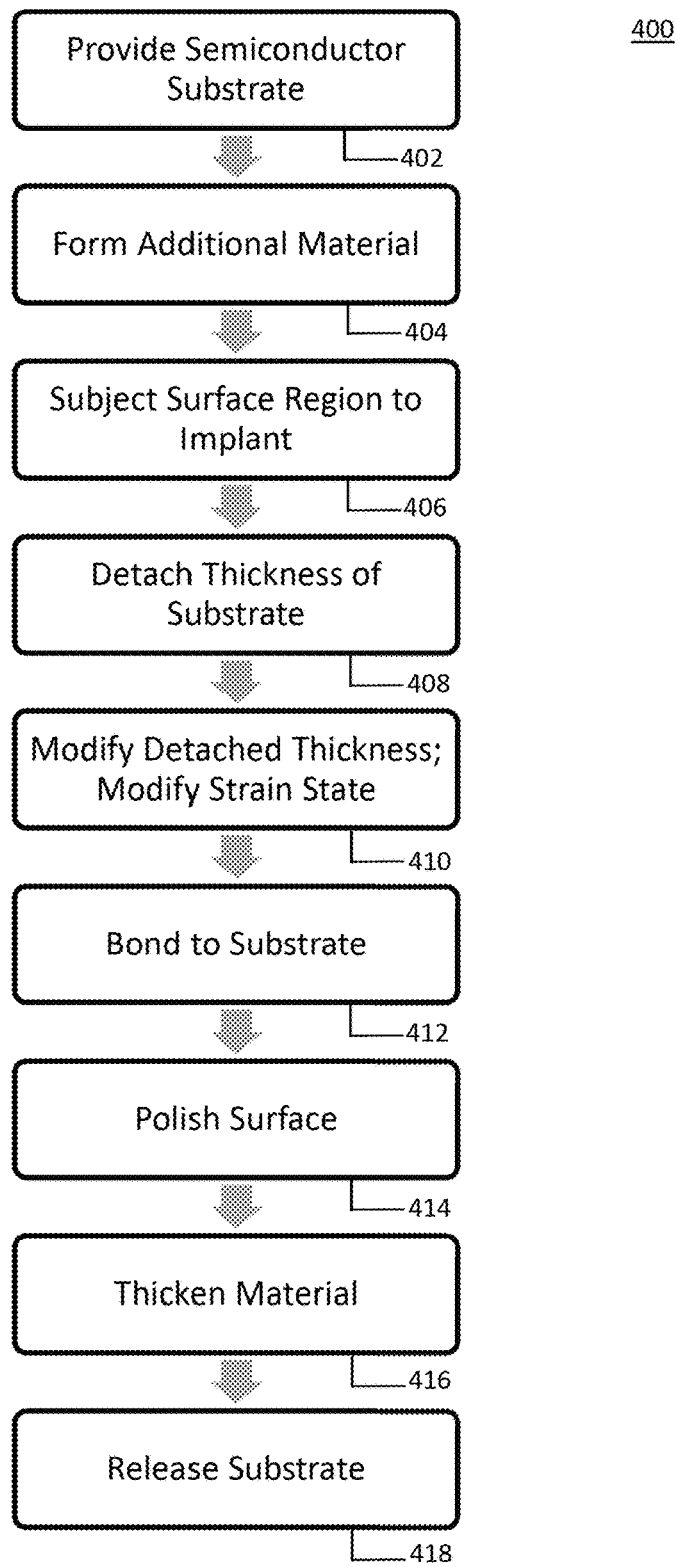
FIG. 4 is a chart showing various steps which may be employed to form an optoelectronic device according to certain embodiments.
Figure 5:
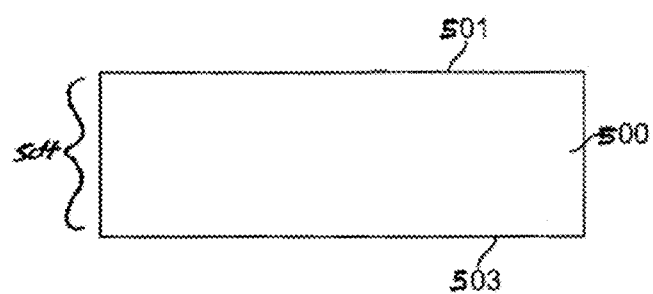
FIGS. 5-11 show certain steps of various layer transfer processes.

Thus as indicated above, embodiments may benefit the HB-LED industry in numerous areas, including but not limited to cost, packaging, and reliability. This is illustrated in FIG. 3E FIG. 4 is a chart 400 showing various steps which may be employed to form an optoelectronic device according to certain embodiments of the present invention.

1. Provide (402) a semiconductor substrate having a surface region and a thickness;
2. Optionally, form (404) a layer of additional material on the surface region;
3. Subject (406) the surface region of the semiconductor substrate (including any additional material formed thereon) to a first plurality of high velocity particles generated using a particle accelerator, to form a cleave region separated from the surface region by a thickness;

4. Detach (408) a thickness of the semiconductor substrate between the surface region and the cleave region, including any additional material.
5. Optionally, modify (410) the detached thickness of material.
6. Optionally, releasably or permanently bond (412) either the detached thickness of material or additional material, to a substrate (which may be a CTE-matched substrate).
7. Polish (414) a surface of the detached thickness of material or remaining additional material.
8. Optionally, thicken (416) existing additional material, or form additional material.
9. Optionally, release (418) the substrate from the detached thickness of material or the additional material.
10. Perform other steps as desired.

The above sequence of steps provide a method according to certain embodiments of the present invention. Other alternatives can also be provided where steps may be added, one or more steps may be removed, or one or more steps may be provided in a different sequence without departing from the scope of the claims herein.

For example, while the above describes implantation of particles through the additional layer to form a cleave region at a depth into the workpiece, this is not required. According to alternative embodiments, accelerated particles could be directed at the additional layer in a manner (e.g. energy) calculated to form a cleave region at or near an interface between the additional material and the underlying workpiece. The presence of the implanted particles in a region at or near this interface, could ultimately reduce an amount of applied energy required to initiate and/or propagate cleaving in a cleave region located proximate to the interface.

And while the above description has focused upon forming an additional material on a workpiece comprising single crystal GaN to form a multi-layer structure, this is also not required. According to alternative embodiments, the additional material could be present on a workpiece. One example of such additional material is single-crystal SiC, (111) silicon, single-crystal and metal films where the material can serve as a seed layer for GaN heteroepitaxial growth.

It is further noted that the choice of material for both the workpiece and for the additional layer, can play a role in determining a character of the stress/strain experienced by the additional layer. For example, the choice of workpiece/additional layer may also determine a relative mismatch in coefficient in thermal expansion between them, which in turn can contribute to both the polarity and magnitude of stress/strain arising in the additional layer over a range of temperatures. In view of the above, the workpiece and/or the additional layer materials can be carefully selected to achieve a desired layer of stress/strain within the additional layer over various processing steps.

FIGS. 5-11 are simplified diagrams illustrating a method of forming substrates or free standing layers using a layer transfer process according to an embodiment of the present invention. These diagrams are merely examples, which should not unduly limit the scope of the claims recited herein. One of ordinary skill in the art would recognize many variations, modifications, and alternatives.

As shown, the method begins by providing a semiconductor substrate or semiconductor material in bulk form 500 having a surface region 501, a backside 503 and a thickness 504. Such thickness can be an entirety of an ingot or sliced from a larger ingot or the like. Specifically, the thickness 504 may represent that of an entirety of the bulk material in its original form (e.g. as an entire ingot, boule, tile, or plate), or may represent a thickness of the bulk material previously separated from its original form (e.g. by sawing or slicing an original ingot, boule, tile, or plate). In a specific embodiment, the semiconductor substrate or bulk material can be a single crystal silicon wafer or ingot, a polysilicon cast wafer, tile, or substrate, a silicon germanium wafer, a germanium wafer, a substrate of group III/V materials, group II/VI materials, gallium nitride, or the like. The substrate or bulk material can be a photonic material. This donor material can be provided in bulk form or can be a substrate assembly where backing materials and layers can be attached to the semiconductor substrate to provide the desired mechanical, process and handling characteristics during the manufacture of the template growth substrate. Top surface layers can be present such as temporary or permanent barrier layers for protecting the bulk material from implant process related contamination or layers that will serve a function in the subsequent processes such as a bond layer (for example metal or oxide layers). In a specific embodiment, a silicon dioxide or AlN layer can be applied through sputtering or PECVD and optionally densified prior to the implant step. If a film or film stack is applied, it may be of limited total thickness to allow the implant at the selected energy to penetrate into the bulk at the desired cleave depth. Of course there can be other variations, modifications, and alternatives.

Figure 6:
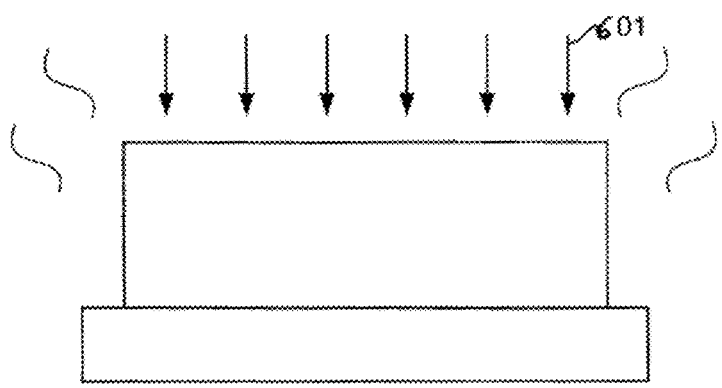

Referring to FIG. 6, the method includes subjecting the surface region of the semiconductor substrate or bulk material to a first plurality of high energy particles 601. In accordance with particular embodiments, the high energy particles 601 can be generated using a particle accelerator. Here, the accelerator can either be a linear accelerator, a plasma immersion ion implantation tool, an ion shower. Under appropriate conditions, mass-selected or non mass-selected implant technologies can be used.

Figure 7:
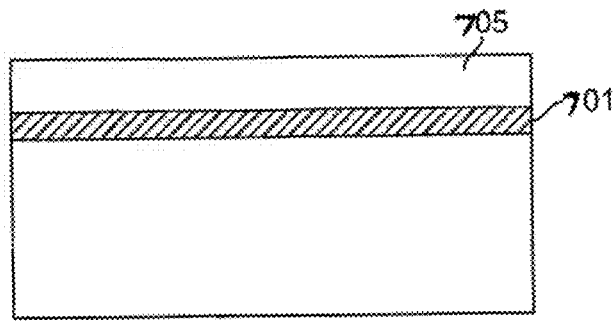

As shown in the simplified diagram of FIG. 7, in a specific embodiment the particles cause formation of a plurality of gettering sites or an accumulation region within a cleave region 701, which is provided beneath the surface region to define a thickness of the bulk material 705 that is to be detached (in some embodiments as a free standing layer). The first plurality of high energy particles may provide an implant profile having a peak concentration and a distribution spatially disposed within a depth of the semiconductor substrate. The distribution can have a width of about 2 μm and less, where this depth variation of an implant concentration profile is called the longitudinal straggle. For a 2 MeV hydrogen implant in GaN, the implant depth is about 25 μm, and the straggle is about 0.7 μm.

In certain embodiments, the cleave region is maintained at a first temperature, which can be provided directly or indirectly. That is, the temperature can be provided by convection, conduction, radiation, or a combination of these techniques according to a specific embodiment. Additionally, the high-energy particle beam may also provide part of the thermal energy and in combination with an external temperature source to achieve the desired implant temperature. In certain embodiments, the high-energy particle beam alone may provide the entire thermal energy desired for implant. That is, the high energy particle beam can be provided that directly causes energy to be converted into thermal energy to increase the temperature of the substrate or bulk material. Of course there can be other variations, modifications, and alternatives.

Depending upon the application, according to particular embodiments smaller mass particles are generally selected to decrease the energy requirement for implantation to a desired depth in a material and to reduce a possibility of damage to the material region according to a preferred embodiment. That is, smaller mass particles more easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral or charged particles including ions such as ion species of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

For example, using hydrogen as the implanted species into a GaN surface as an example, the implantation process is performed using a specific set of conditions. Implantation dose ranges of hydrogen from about $5 \times 10^{16}$ to about $5 \times 10^{17}$ atoms/cm$^2$, and preferably the dose of implanted hydrogen is less than about $2 \times 10^{17}$ atoms/cm$^2$, and may be less than about $5 \times 10^{16}$ atoms/cm$^2$. Implantation energy ranges from about 0.5 MeV and greater to about 2 MeV for the formation of thick films useful for opto-electronic applications. In certain bonded substrate embodiments implantation energy may be below 500 keV, for example 5-180 keV. Implantation temperature ranges from about −50 to about +500 Degrees Celsius, may be between about 100-500 Degree Celsius, and is preferably less than about 700 Degrees Celsius to prevent a possibility of hydrogen ions from diffusing out of the implanted GaN material. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using GaN as an example, the energy range of implantation can be quite large and span from a few keV for template formation for HB-LED or GaN power electronics applications where a subsequent epitaxial growth is needed to fabricate the GaN device structure, to many MeV yielding substrates measuring tens of micron in thickness for use as a kerfless freestanding wafer starting material. The general range of implant depth as a function of the implant energy can be calculated using, for example SRIM 2013 (Stopping Range In Matter) or a Monte Carlo simulation program (http://www.srim.org/). In a specific embodiment, the GaN film thickness ranges from about 0.05 micrometers to about 1 micrometers using proton implant energy ranges from about 5 keV to about 180 keV. In other embodiments the GaN film may be a free standing GaN layer having a thickness from about 10 micrometers to about 70 micrometers. Of course there can be other variations, modifications, and alternatives.

The terms "detached" or "transferred GaN thickness" in this context mean that the GaN film thickness formed by the implanted ion range can be released to a free standing state or released to a permanent substrate or a temporary substrate for eventual use as a free standing substrate, or eventually mounted onto a permanent substrate. In some embodiments, the GaN material is sufficiently thick and free from a handle or transfer substrate, which acts as a supporting member. Of course, the particular process for handling and processing of the film will depend on the specific process and application.

Figure 8:
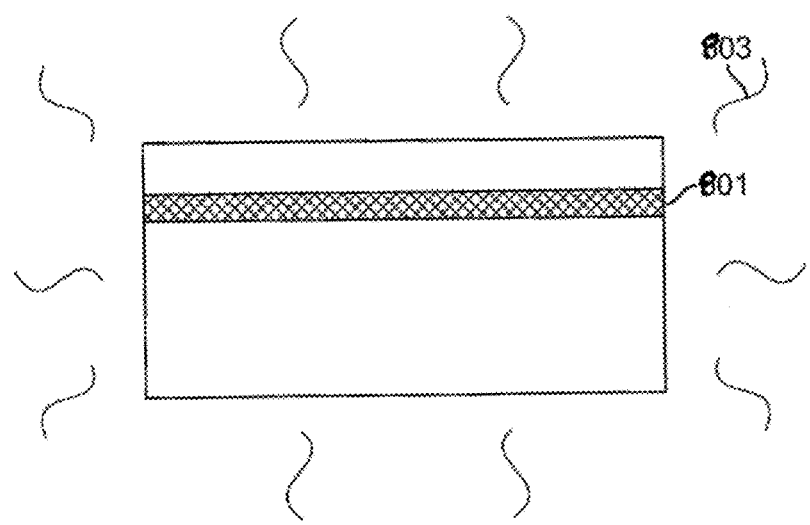

Referring now to FIG. 8, an embodiment in accordance with the present invention may optionally perform a thermal treatment process 803 on the semiconductor substrate or bulk material to further form the plurality of gettering sites within the cleave region. That is, the thermal treatment process anneals out and/or quenches the cleave region to fix 801 the plurality of first particles in place. The thermal treatment provides a fixed network of defects that can act as efficient sites for gettering and accumulating particles in a subsequent implantation or particle accumulation/diffusion process.

Without being tied to a particular theory or mechanism, in a specific embodiment, the increased temperature is believed to precipitate a network of permanent defects, and may also trap a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below.

In accordance with one embodiment, the optional thermal treatment can occur using conduction, convection, radiation, or any combination of these techniques. The particle beam may also provide part of the thermal energy and in combination with an external temperature source to achieve the desired implant temperature. In certain embodiments, the particle beam alone may provide the entire thermal energy desired for implant. Of course, there can be other variations, modifications, and alternatives.

Figure 9:
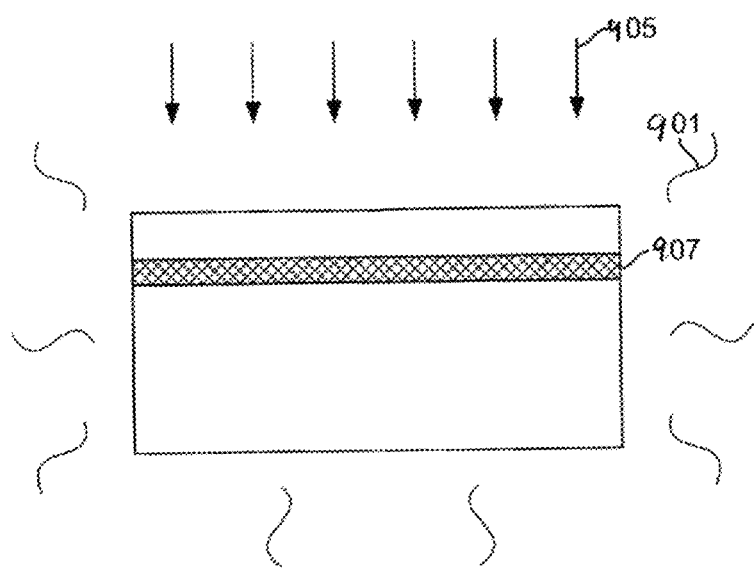

A specific embodiment may include subjecting the surface region of the semiconductor substrate or bulk material to a second plurality of high energy particles, which may be generated using a linear accelerator or other accelerated ion implanter such as a PIII system, as illustrated in the simplified diagram of FIG. 9. As shown, the method includes the second plurality of high energy particles 905, which are provided in the semiconductor substrate or bulk material. The second particles are introduced into the cleave region 907, which increases a stress level of the cleave region from a first stress level to a second stress level from the second plurality of high velocity particles. In a specific embodiment, the second stress level is suitable for a subsequent cleaving process. In a particular embodiment, the semiconductor substrate or bulk material is maintained at a second temperature 901, which is higher than the first temperature.

Using hydrogen as the species implanted into the bulk single crystal GaN material in the second implantation step as an example, the implantation process is performed using a specific set of conditions. Implantation dose ranges from about $5 \times 10^{16}$ to about $5 \times 10^{17}$ atoms/cm$^2$, and preferably the dose is less than about $1 \times 10^{17}$ atoms/cm$^2$. Implantation energy ranges from about 5 keV and greater to about 0.5 MeV and greater for the formation of thicker films. Implant dose rate can be provided at about 500 microamperes to about 100 milliamperes and a total dose rate can be calculated by integrating an implantation rate over the expanded beam area. Implantation temperature ranges from about −50 Degree Celsius to about 700 Degrees Celsius, and is preferably less than about 500 Degrees Celsius. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies, it may be useful to have a substantially pure proton implantation (e.g., positive or negatively charged) to allow for a maximum range of the cleaving plane within the reusable substrate. Using GaN as an example, the energy range of implantation can be large and span from a few keV for template formation for HB-LED or GaN power electronics applications where a subsequent epitaxial growth is needed to fabricate the GaN device structure, to many MeV yielding substrates measuring tens of micron in thickness for use as a kerfless free-standing wafer starting material. The general range of implant depth as a function of the implant energy can be calculated using, for example SRIM 2013 (Stopping Range In Matter) or a Monte Carlo simulation program (http://www.srim.org/). In a specific embodiment, the GaN film thickness ranges from about 0.05 micrometers to about 1 micrometers using proton implant energy ranges from about 5 keV to about 180 keV. In some embodiments the GaN film may be a free standing GaN layer having a thickness from about 10 micrometers to about 70 micrometers. Of course there can be other variations, modifications, and alternatives.

Effectively, the implanted particles add stress or reduce fracture energy along a plane parallel to the top surface of the substrate or bulk material at the selected depth. The energies depend, in part, upon the implantation species and conditions. These particles reduce a fracture energy level of the substrate or bulk material at the selected depth. This allows for a controlled cleave along the implanted plane at the selected depth. Implantation can occur under conditions such that the energy state of the substrate or bulk material at all internal locations is insufficient to initiate a non-reversible fracture (i.e., separation or cleaving) in the substrate or bulk material. It should be noted, however, that implantation does generally cause a certain amount of defects (e.g., micro-detects) in the substrate or bulk material that can typically at least partially be repaired by subsequent heat treatment, e.g., thermal annealing or rapid thermal annealing.

A mass-selected high-energy implant approach, which has the appropriate beam intensity could be used to manufacture thicker cleaved bulk materials. To be cost-effective, the implant beam current should be on the order of a few tens of milliamps of H+ or H− ion beam current. If the system can implant such sufficiently high energies, $H_2^+$ ions can also be advantageously utilized for achieving higher dose rates. Ion implant apparatuses useful for embodiments of the present invention have been made recently available by the use of DC electrostatic particle accelerators such as the DYNAMITRON proton accelerator available from Ion Beam Applications SA, Belgium). Other forms of DC electrostatic accelerators which may be used include Van de Graaff or Tandem Van de Graaff accelerator types.

Still other forms of particle accelerators suitable for use in accordance with embodiments of the present invention may include radio frequency (RF) particle accelerators such as a cyclotron or a RF linear accelerator (RF Linac). Examples of possible particle accelerator types include radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1\times10^{17}$ H/cm$^2$ and an expanded beam of about 500 mm×500 mm, the GaN area processed per hour at the target implantation dose is about 0.7 square meters while the power flux is kept to about 13 Watts/cm$^2$. This combination of parameters makes this approach particularly practical for cost effective HB-LED substrate material production. Of course, there can be other variations, alternatives, and modifications.

Optionally, specific embodiments may include a thermal treatment process after the implanting process. According to a specific embodiment, the present method uses a thermal process ranging from about 150 to about 800 Degrees Celsius for GaN material. In an embodiment, the thermal treatment can occur using conduction, convection, radiation, or any combination of these techniques. The high-energy particle beam may also provide part of the thermal energy and in combination with an external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Figure 10:
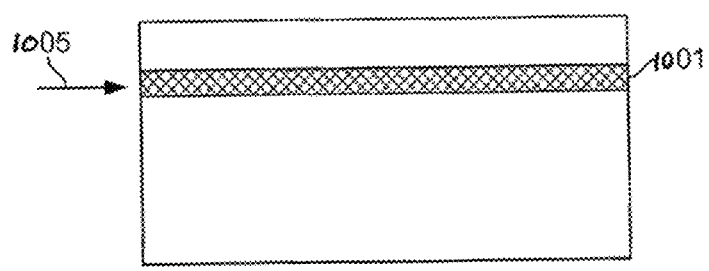

Specific embodiments may include a cleave initiation step, wherein some energy 1005 is applied to the cleave portion to begin cleaving, as is illustrated in FIG. 10. As described in detail below, this cleave initiation could involve the application of different types of energy, having different characteristics.

Figure 11:
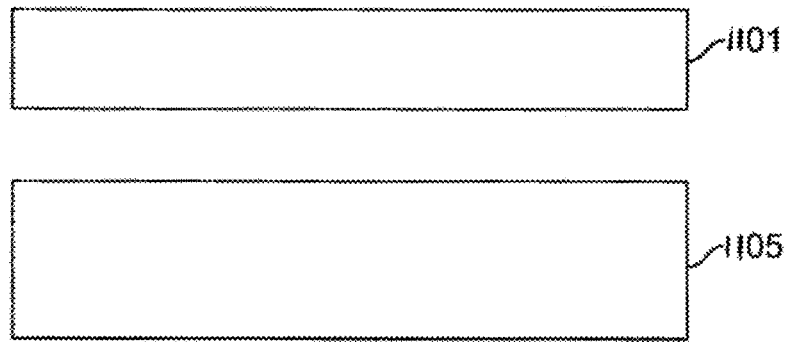

Specific embodiments include a step of freeing the thickness of detachable material, (which may or may not be free standing), using a cleaving process, as illustrated by FIG. 11. As shown, the detachable material 1101 is removed from the remaining substrate portion or bulk material 1105. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method in accordance with an embodiment of the present invention frees the thickness of material (which may be free standing) from the substrate or bulk material to completely remove the thickness of material. Of course, there can be other variations, alternatives, and modifications.

A method may use one or more patterned regions to facilitate initiation of a cleaving action. In a specific embodiment, the present method provides a semiconductor substrate having a surface region and a thickness. The method includes subjecting the surface region of the semiconductor substrate to a first plurality of high energy particles generated using a particle accelerator to form a patterned region of a plurality of gettering sites within a cleave region. In a preferred embodiment, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process.

In one embodiment, the patterned implant sequence subjects the surface to a dose variation where the initiation area is usually developed using a higher dose and/or thermal budget sequence. Propagation of the cleaving action to complete the cleaving action can occur using additional dosed regions to guide the propagating cleave front. Alternatively, cleaving propagation can be accomplished by following a depth that is guided using stress-control. Propagation of the cleaving can be achieved by following a natural crystallographic cleave plane. One or more of these techniques may be applied in conjunction with one another. Some or most of the area may be implanted at a lesser dose or not implanted at all depending on the particular cleaving technique used. Such lower dosed regions can help improve overall productivity of the implantation system by reducing the total dose needed to detach each film from the substrate.

In a specific embodiments, methods can perform other processes. For example, the method can place the thickness of detached material on a support member, which is later processed. Additionally or optionally, the method in accordance with an embodiment of the present invention performs one or more processes on the semiconductor substrate or bulk material before subjecting the surface region with the first plurality of high energy particles, or between the implanting step(s) and the cleaving step. Depending upon the particular embodiment, the processes can be for the formation of illumination devices, or layers used within a cell process, integrated circuits, optical devices, any combination of these, and the like. Of course, there can be other variations, modifications, and alternatives.

As described above, improved techniques for removing a thin film of material from a substrate using a controlled cleaving action are provided. This technique allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material from the substrate.

In a specific embodiment, a process is provided for forming a film of material from a donor substrate using a controlled cleaving process. The process includes a step of introducing energetic particles (e.g., charged or neutral molecules, atoms, or electrons having sufficient kinetic energy) through a surface of a donor substrate to a selected depth underneath the surface, where the particles are at a relatively high concentration to define a thickness of donor substrate material (e.g., thin film of detachable material) above the selected depth. To cleave the donor substrate material, the method provides energy to a selected region of the donor substrate to initiate a controlled cleaving action in the donor substrate, whereupon the cleaving action is made using a propagating cleave front(s) to free the donor material from a remaining portion of the donor substrate.

A cleave may be initiated by subjecting the material with sufficient energy to fracture the material in one region, causing a cleave front, without uncontrolled shattering or cracking. The cleave front formation energy (E) must often be made lower than the bulk material fracture energy (Etna) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy (4). The relationship can be expressed as:

$$Ec = Ep + [\text{cleave front stress energy}]$$

A controlled cleaving process is realized by reducing Ep along a favored direction(s) above all others and limiting the available energy to below the Ep of other undesired directions. In any cleave process, a better cleave surface finish occurs when the cleave process occurs through only one expanding cleave front, although multiple cleave fronts do work.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the substrate while preventing a possibility of damage to the film or a remaining portion of the substrate. Accordingly, the remaining substrate portion can be re-used repeatedly for other applications.

Additionally, the present invention uses a relatively low temperature during the controlled cleaving process of the thin film to reduce temperature excursions of the separated film, donor substrate, or multi-material films according to other embodiments. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, the present invention reduces damage caused by higher than necessary stress or pressure effects and nucleation sites caused by the energetic particles as compared to pre-existing techniques.

1. Controlled Cleaving Techniques

Figure 12:
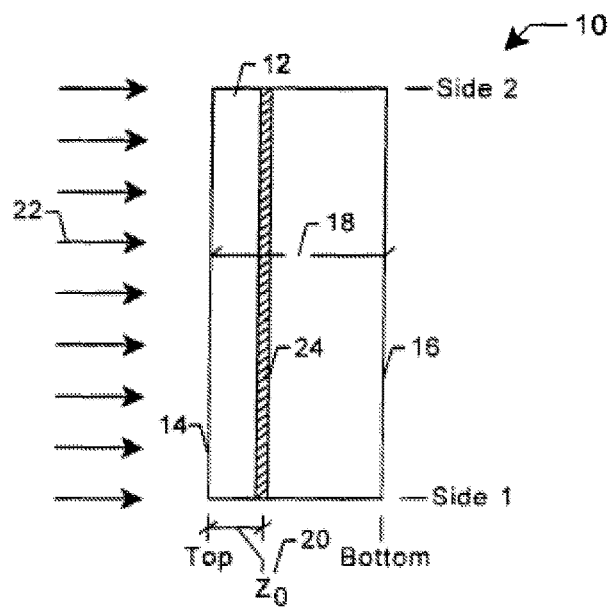

FIG. 12 is a simplified cross-sectional view diagram of a substrate 10 according to the present invention. The diagram is merely an illustration and should not limit the scope of the claims herein. As merely an example, substrate 10 is a donor GaN wafer which includes a material region 12 to be removed, which is a thin relatively uniform film derived from the substrate material. The donor GaN wafer 10 includes a top surface 14, a bottom surface 16, and a thickness 18. Substrate 10 also has a first side (side 1) and a second side (side 2) (which are also referenced below in the Figs.). Material region 12 also includes a thickness 20, within the thickness 18 of the GaN material. A novel technique removes the material region 12 using the following sequence of steps.

Selected energetic particles implant 22 through the top surface 14 of the GaN material to a selected depth 24, which defines the thickness 20 of the material region 12, termed the "thin film" of material. A variety of techniques can be used to implant the energetic particles into the GaN material. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion ion implantation techniques are described in "Recent Applications of Plasma Immersion Ion Implantation," Paul K. Chu, Chung Chan, and Nathan W. Cheung, SEMICONDUCTOR INTERNATIONAL, pp. 165-172, June 1996, and "Plasma Immersion Ion Implantation—A Fledgling Technique for Semiconductor Processing," P. K. Chu, S. Qin, C. Chan, N. W. Cheung, and L. A. Larson, MATERIALS SCIENCE AND ENGINEERING REPORTS: A REVIEW JOURNAL, pp. 207-280, Vol. R17, Nos. 6-7, (Nov. 30, 1996), which are both hereby incorporated by reference for all purposes. Of course, techniques used depend upon the application.

A basic configuration of one PIII system is shown in FIG. 33. This figure shows the target holder 3300 supporting the target 3302 to be implanted. The target holder may comprise a high-voltage isolated cooled chuck 3304 with electrostatic or mechanical clamping to allow the target material to be thermally contacted to the target holder. This can be accomplished by conduction cooling (e.g. through an elastomer or other compliant layer allowing efficient contacting of the backside of the target) or by convection cooling (e.g. by developing gas pressure between the backside of the target and the target holder). Sometimes, a combination of conduction and convection cooling may be employed. During this plasma soak time, the target is directly immersed in the plasma 3306.

FIG. 34 shows the target holder and target being briefly pulsed to a large negative voltage (−V) 3308. During this time, a sheath free of charged particles is developed around the target holder assembly. The voltage is dropped across the thickness of the sheath.

Implantation occurs by the positive charges diffusing across the plasma/sheath interface to accelerate and strike the surface of the target holder assembly with energy equal to V. For example, a pulse of −40 kV could accelerate H+ protons within a hydrogen plasma to an energy of 40 keV. This implantation process continues at a rate determined by parameters such as the plasma density and ion specie. To avoid arcing, the high-voltage may be applied for a brief period of time and repeated at a selected repetition rate. Typical PIII operating parameters can be 20-1000 Hz repetition frequency (Fr), and pulse widths (Tp) of a few microseconds to more than 100 microseconds. If the peak ion current (Iion) and effective target holder area (A) are known, the dose rate can be calculated as:

$$\text{Dose Rate(ions/cm}^2) = I\text{ion} \times Fr \times Tp/qA,$$

where q is the electronic charge.

When charged particles hit the target holder assembly, secondary electrons are ejected from the surface to be accelerated in the reverse direction. The electron yield (number of electrons emitted per positive charged particle implanted) is called gamma (γ).

Typical gamma factors are 2-5. Therefore, the net pulse current is dominated by the secondary electron current. Since these electrons hit the plasma chamber walls and decelerate, x-rays are produced at implant energies (V) exceeding 30-40 kV. In an example, the total current and implant power may be:

$$\text{Implant Current} = I\text{ion} \times (1+\gamma) \times Fr \times Tp$$

$$\text{Implant Power} = I\text{ion} \times (1+\gamma) \times Fr \times Tp \times V$$

This fundamental PIII technique may experience some issues for high-dose applications (e.g. up to $5 \times 10^{17}$ atoms/cm$^2$) for GaN cleave plane formation. Some of these issues of PIII that may be relevant to these high-dose implants and specifically for GaN high-dose implants, are now listed as follows.

1. The target GaN surface is immersed in a high-density hydrogen plasma and will etch in this environment. A barrier layer such as Molybdenum may be deposited on the GaN surface, but this can lower the final cleave depth and add cost and complexity to the process.
2. Arcing sometimes occurs in the PIII chamber during a process. This can lower yields and quality if the arcs leave pits and other marks on the GaN surface.
3. The GaN implant process may involve both high dose rate for cost considerations and low GaN substrate temperature. This is challenging since the GaN is also substantially heated by the plasma.

It may therefore be desirable to modify the PIII implant apparatus to mitigate or eliminate the above issues.

An alternative embodiment of a PIII system is shown in FIG. 35. In this and similar configurations (also referenced herein as "Drift-Mode PIII"), a top plate 3500 with holes 3502 is placed between the target 3504 and the plasma chamber 3506 with side spacers 3508 to form a wafer enclosure or cavity 3510. The holes may be arrayed in a repeating pattern to allow uniform scanning and to achieve a certain particle implant transparency Tr (area of holes/total area). FIG. 36 shows a close-packed hole pattern which can give Tr values of 45-60%. In certain embodiments according to a Drift-Mode PIII configuration, plasma diffuses into showerhead holes with aspect ratios >1:1. As the plasma diffuses down into the holes (and through the channels defined thereby), the plasma is substantially quenched before reaching the bottom of the hole. As a consequence of this, the target substrate is largely protected from background plasma ion etching.

To reduce/eliminate residual plasma ions from reaching the target, an optional field plate 3512 (for example a thin film of conductive material isolated from the other plates) may be negatively biased under the top showerhead plate to attract the residual ions away from the target surface. This field plate may also offer the added benefit of repelling secondary electrons generated by the ions striking the target surface from exiting the cavity. The bias applied to the field plate could be selected to overcome the ion plasma temperature (usually 3-15 eV). Therefore, a bias of negative 5-25V referenced to the target holder and top plate could effectively stop any residual etching. Its effect on the implanting particles could be minimal by reducing the implant energy by about 5-25 eV.

During the HV pulse, the high energy ions pass these channels into the wafer enclosure, essentially unaffected by the weak electric sheath fields within the channels, while leaving the plasma electrons behind. As the ions leave the bottom of the channels, these ion beamlets now expand since they are not electrically neutralized by the plasma electrons. This beam divergence aids in implant uniformity by filling gaps in ion flux between adjacent channels. By including substrate movement in two dimensions of the order of the hole pitch, non-uniformities due to the lower than 100% ion transparency may be significantly reduced or eliminated regardless of the ion distribution. Substrate motion in two dimensions (Cartesian if rectangular, or polar if circular) averages out non-uniformities in the ion flux if the scans are of the order of the channel aperture (i.e. pitch) and the frequencies for the two dimensions are in ratios of non-rational numbers to ensure random motion. For a uniform implant dose distribution, the scanning may be designed to achieve the same beam dwell time over each point on the wafer surface. Scanning speeds may accomplish at least a scan cycle at the end of the implant, which could last between about 15-120 minutes according to some embodiments.

If a patterned implant is desired, a modification to the hole transparency or hole pattern can be made that interact with the scan pattern to change the dose profile or value to a desired condition. For example, a higher Tr area at an edge area could produce a higher dose implant area to facilitate a Controlled-Cleave Process.

Such configurations may also offer benefits in controlling and even reducing the total implant power at an equivalent dose rate. This may be accomplished by using a higher Tr hole pattern which can reduce the effective gamma of the system. According to this configuration, some of the ions go through the top plate holes and some ions strike the top plate.

For the ions that enter the holes in the top plate, these ions contribute to the target implant but do not generate secondary electrons within the system ($\gamma=0$). The ion dose rate and implant power may thus be expressed as:

Dose Rate(ions/cm$^2$)=$I$ion$\times Fr \times Tp \times Tr/qA$, where q is the electronic charge;

Implant Power(ions through holes)=$I$ion$\times Fr \times Tp \times Tr \times V$.

For the ions striking the top plate:

Implant Power(ions through holes)=$I$ion$\times(1+\gamma)\times Fr \times Tp \times (1-Tr)\times V$ Total Implant power is therefore:

Total Implant Power=$I$ion$\times Fr \times Tp \times V \times [Tr+(1+\gamma)\times(1-Tr)]$ The power ratio is defined as the power using this configuration divided by the base power dissipation when Tr=100%:

Power Ratio=$(1+\gamma\times(1-Tr))/(1+\gamma)$

Since the dose rate ratio is simply Tr, the threshold Tr value at which the dose rate and power ratio are equal can be derived as:

Tr(threshold)=$(1+\gamma)/(1+2\gamma)$

For example, for $\gamma=4$, the threshold transparency Tr value is 55%. At this point, both the dose rate and the total power are reduced to 55% of their original values. Starting at this Tr value, increasing the implant pulse frequency by 1/Tr would increase the dose rate back to the original configuration (no top plate) values but with equal or lower total implant power dissipation.

This power management method can be extended to the other areas of the target holder by forming "blind holes" within the exposed surfaces. The same power mitigation effect can occur as long as the holes are deep enough to stop the secondary electrons from exiting the holes.

One or more possible benefits of the Drift-Mode PIII configuration are listed below:

1) reduced arcing by presenting to the plasma a reproducible, conditioned surface (showerhead) for the plasma during implant (i.e. plasma does not see a new target wafer surface at each new implant) & reduced flux of high energy secondary electrons to the chamber walls; eliminating arcing events on the target wafer surface;
2) good top plate transparency allows significant ion flux;
3) no barrier layers on the target substrate are needed to protect from plasma etching;
4) reduced power & current requirements are possible by significantly reducing the production of secondary electrons which consume significant implant power & impose excessive levels of total current to support a smaller fraction of ion implant current;
5) improved dose control and uniformity by scanning the sample in a geometrical manner to convolving the implant distribution independently of the implant beamlet profile;
6) further reduction of secondary electron emission & the attendant by auxiliary blind holes with sufficient aspect ratio in the high voltage biased pedestal;
7) reduction in hazardous X-rays by reduction of high energy electron flux to grounded surfaces.

Depending upon the application, smaller mass particles are generally selected to reduce a possibility of damage to the material region 12. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes, rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

For example, using hydrogen as the implanted species into a GaN surface as an example, the implantation process may be performed using a specific set of conditions. Implantation dose ranges of hydrogen from about $5\times10^{16}$ to about $5\times10^{17}$ atoms/cm$^2$, and the dose of implanted hydrogen can be less than about $2\times10^{17}$ atoms/cm$^2$, and may be less than about $5\times10^{16}$ atoms/cm$^2$. Implantation energy may range from about 0.5 MeV and greater to about 2 MeV for the formation of thick films useful for opto-electronic applications. In certain bonded substrate embodiments implantation energy may be below 500 keV, for example 5-180 keV. Implantation temperature ranges from about −50 to about +500 Degrees Celsius, may be between about 100-500 Degree Celsius, and can be less than about 700 Degrees Celsius to prevent a possibility of hydrogen ions from diffusing out of the implanted GaN material. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can typically at least partially be repaired by subsequent heat treatment, e.g., thermal annealing or rapid thermal annealing.

Figure 13:
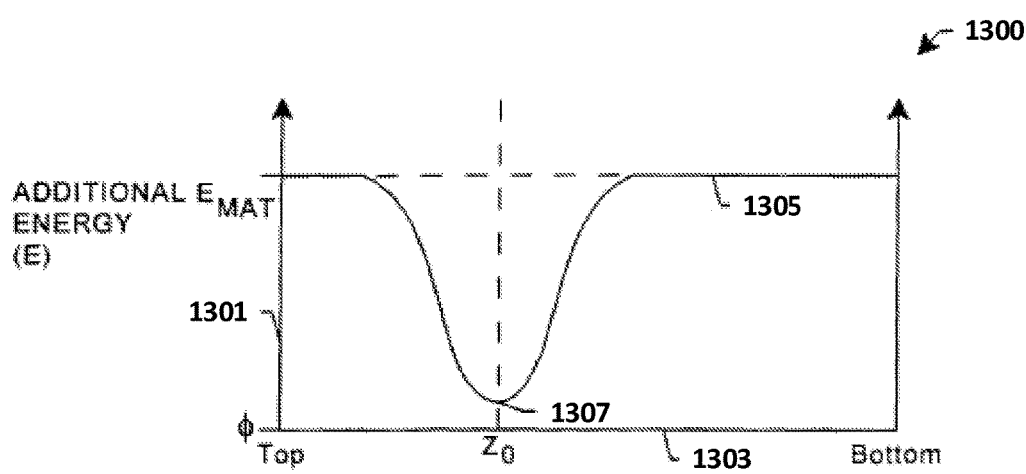

FIG. 13 is a simplified energy diagram 1300 along a cross-section of the implanted substrate 10 according to the present invention. The diagram is merely an illustration and should not limit the scope of the claims herein. The simplified diagram includes a vertical axis 1301 that represents an energy level (E) (or additional energy) to cause a cleave in the substrate. A horizontal axis 1303 represents a depth or distance from the bottom of the wafer to the top of the wafer. After implanting particles into the wafer, the substrate has an average cleave energy represented as E 1305, which is the amount of energy needed to cleave the wafer along various cross-sectional regions along the wafer depth. The cleave energy (Ec) is equal to the bulk material fracture energy (Emat) in non-implanted regions. At the selected depth 20, energy (Ecz) 1307 is lower since the implanted particles essentially break or weaken bonds in the crystalline structure (or increase stress caused by a presence of particles also contributing to lower energy (Ecz) 1307 of the substrate) to lower the amount of energy needed to cleave the substrate at the selected depth. The present invention takes advantage of the lower energy (or increased stress) at the selected depth to cleave the thin film in a controlled manner.

Figure 14:
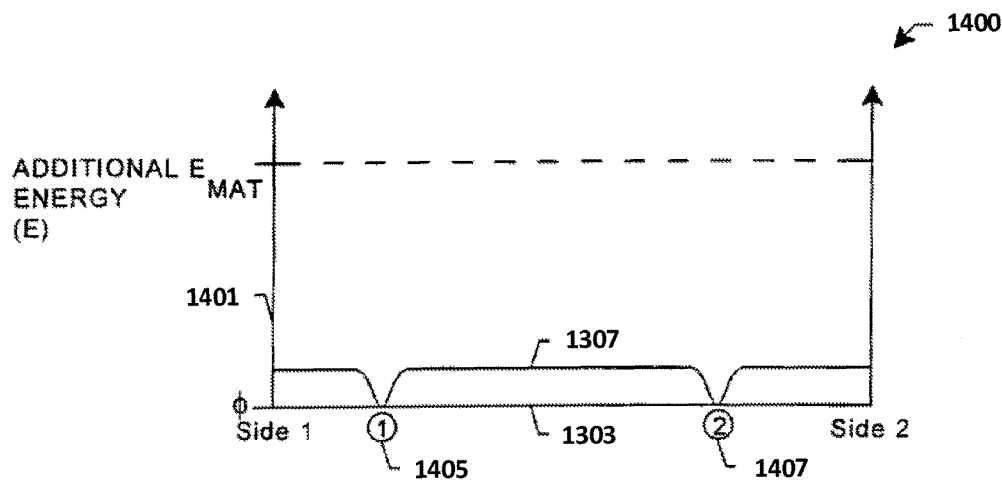

Substrates, however, are not generally free from defects or "weak" regions across the possible cleave front or selected depth $z_o$ after the implantation process. In these cases, the cleave generally cannot be controlled, since they are subject to random variations such as bulk material non-uniformities, built-in stresses, defects, and the like. FIG. 14 is a simplified energy diagram 1400 across a cleave front for the implanted substrate 10 having these defects. The diagram 1400 is merely an illustration and should not limit the scope of the claims herein. The diagram has a vertical axis 1401 which represents additional energy (E) and a horizontal axis 1403 which represents a distance from side 1 to side 2 of the substrate, that is, the horizontal axis represents regions along the cleave front of the substrate. As shown, the cleave front has two regions 1405 and 1407 represented as region 1 and region 2, respectively, which have cleave energies less than the average cleave energy (Ecz) 1307 (possibly due to a higher concentration of defects or the like). Accordingly, it is highly likely that the cleave process begins at one or both of the above regions, since each region has a lower cleave energy than surrounding regions.

Figure 15:
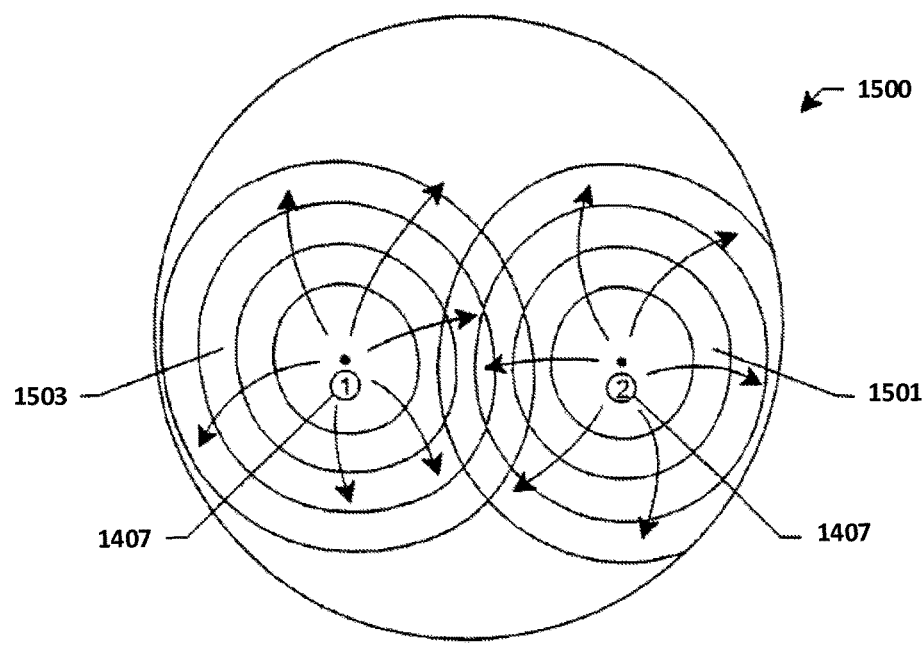

An example of a cleave process for the substrate illustrated by the above FIG. 14 is described as follows with reference to FIG. 15. FIG. 15 is a simplified top-view diagram 1500 of multiple cleave fronts 1501, 1503 propagating through the implanted substrate. The cleave fronts originate at "weaker" regions in the cleave plane, which specifically includes regions 1 and 2. The cleave fronts originate and propagate randomly as shown by the arrows. A limitation with the use of random propagation among multiple cleave fronts is the possibility of having different cleave fronts join along slightly different planes or the possibility of forming cracks, which is described in more detail below.

Figure 16:
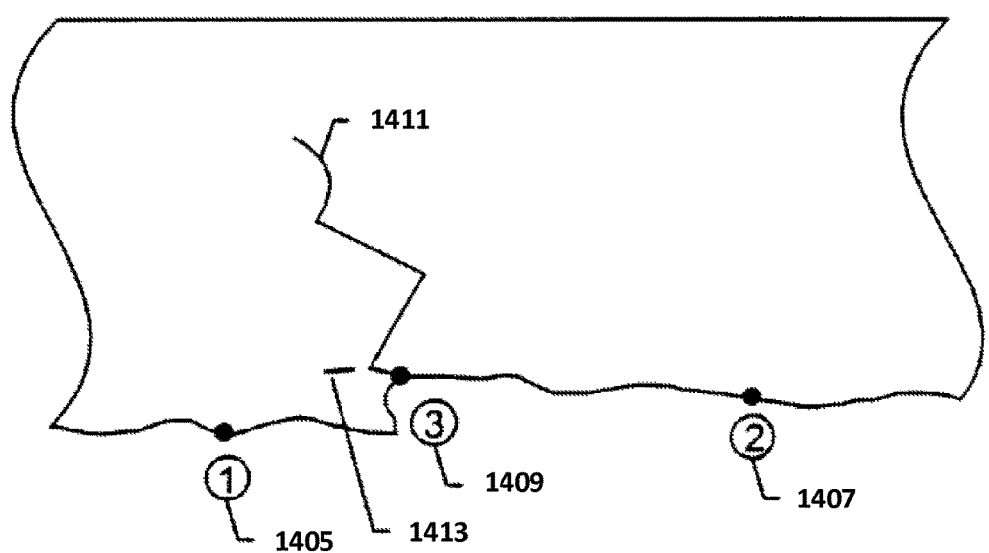

FIG. 16 is a simplified cross-sectional view 1600 of a film cleaved from a wafer having multiple cleave fronts at, for example, regions 1 1405 and 2 1407. This diagram is merely an illustration and should not limit the scope of the claims herein. As shown, the cleave from region 1 joined with the cleave from region 2 at region 3 1409, which is defined along slightly different planes, may initiate a secondary cleave or crack 1411 along the film. Depending upon the magnitude of the difference 1413, the film may not be of sufficient quality for use in manufacture of substrates for integrated circuits or other applications. A substrate having crack 1411 generally cannot be used for processing. Accordingly, it is generally undesirable to cleave a wafer using multiple fronts in a random manner. An example of a technique which may form multiple cleave fronts in a random manner is described in U.S. Pat. No. 5,374,564, which is in the name of Michel Bruel ("Bruel"), and assigned to Commissariat A l'Energie Atomique in France. Bruel generally describes a technique for cleaving an implanted wafer by global thermal treatment (i.e., thermally treating the entire plane of the implant) using thermally activated diffusion. Global thermal treatment of the substrate generally causes an initiation of multiple cleave fronts which propagate independently. In general, Bruel discloses a technique for an "uncontrollable" cleaving action by way of initiating and maintaining a cleaving action by a global thermal source, which may produce undesirable results. These undesirable results include potential problems such as an imperfect joining of cleave fronts, an excessively rough surface finish on the surface of the cleaved material since the energy level for maintaining the cleave exceeds the amount required, and many others. The present invention overcomes the formation of random cleave fronts by a controlled distribution or selective positioning of energy on the implanted substrate.

Figure 17:
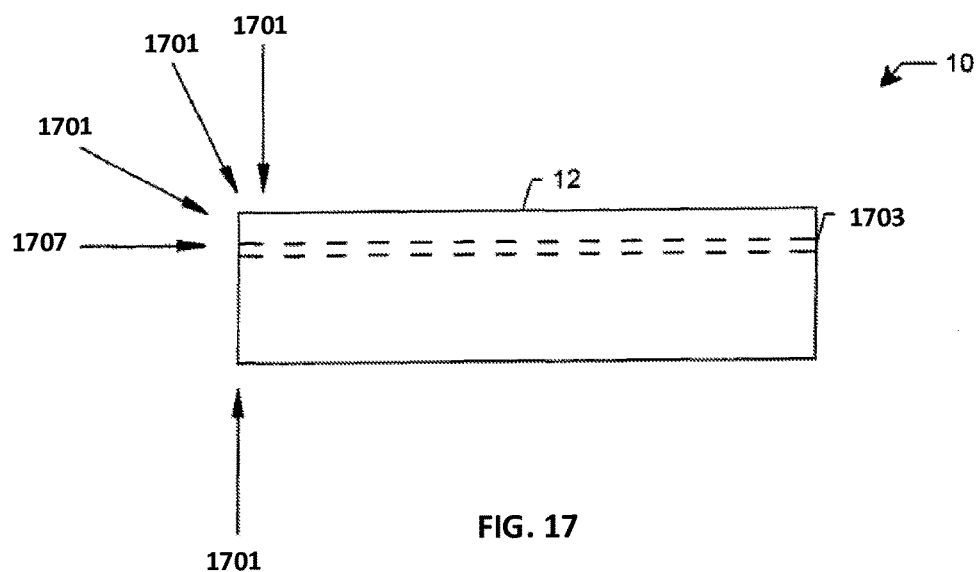

FIG. 17 is a simplified cross-sectional view of an implanted substrate 10 using selective positioning of cleave energy according to the present invention. This diagram is merely an illustration, and should not limit the scope of the claims herein. The implanted wafer undergoes a step of selective energy placement or positioning or targeting which provides a controlled cleaving action of the material region 12 at the selected depth. The impulse or impulses are provided using energy sources. Examples of sources include, among others, a chemical source, a mechanical source, an electrical source, and a thermal sink or source. The chemical source can include particles, fluids, gases, or liquids. These sources can also include a chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, a furnace, and the like. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application.

Figure 18:
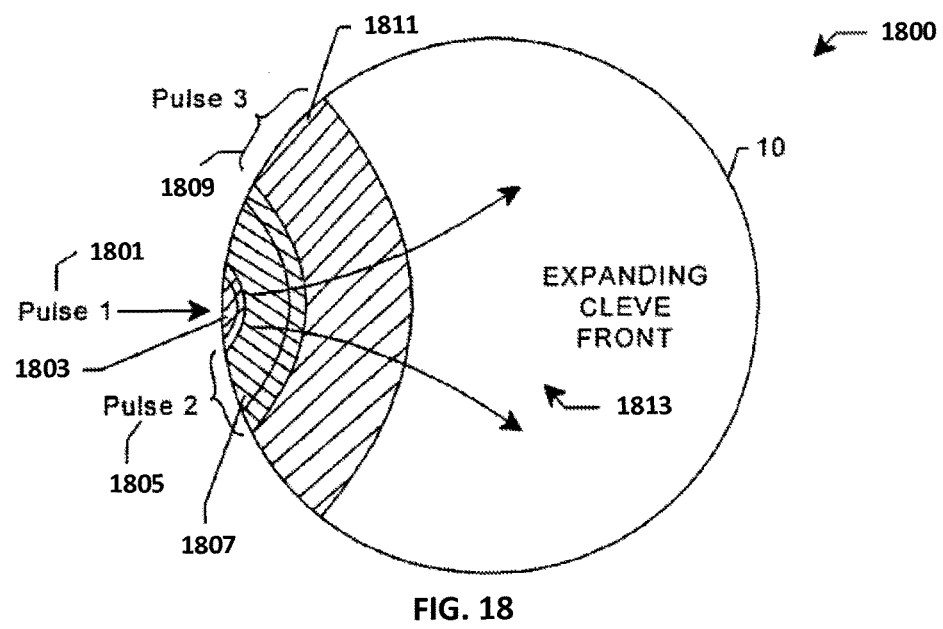

In a specific embodiment, a controlled-propagating cleave is provided. The controlled-propagating cleave uses multiple successive impulses to initiate and perhaps propagate a cleaving process 1800, as illustrated by FIG. 18. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 1801 is directed to an edge 1803 of the substrate to initiate the cleave action. Pulse 2 1805 is also directed at the edge 1807 on one side of pulse 1 to expand the cleave front. Pulse 3 1809 is directed to an opposite edge 1811 of pulse 1 along the expanding cleave front to further remove the material layer from the substrate. The combination of these impulses or pulses provides a controlled cleaving action 1813 of the material layer from the substrate.

FIG. 19 is a simplified illustration of selected energies 1900 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceeds cleave energy formation or propagation energies. More preferably, the impinging beam cools and causes a thermal pulse gradient simultaneously, which exceeds cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the implanted region of the substrate until the thin film of material is removed. A variety of techniques can be used to initiate the cleave action. These techniques are described by way of the Figs. below.

FIG. 20 is a simplified illustration of an energy state 2000 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

Figure 21:
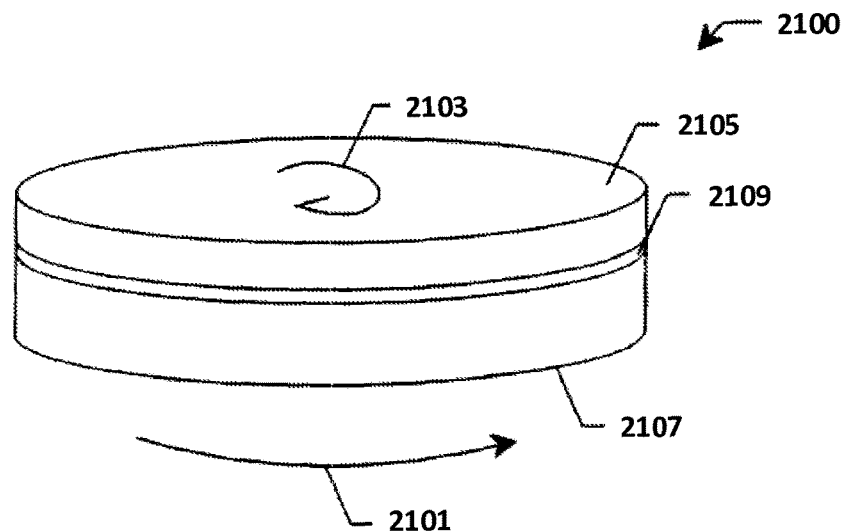
Figure 22:
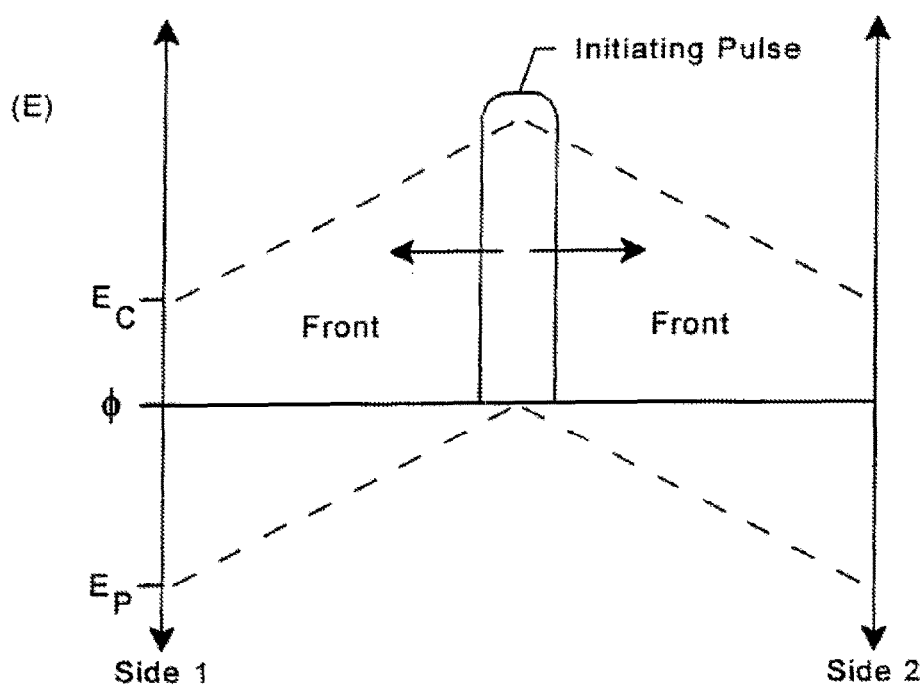

An alternative aspect of the invention is illustrated by FIGS. 21 and 22. FIG. 21 is a simplified illustration of an implanted substrate 2100 undergoing rotational forces 2101, 2103. This diagram is merely an illustration, and should not limit the scope of the claims herein. As shown, the substrate includes a top surface 2105, a bottom surface 2107, and an implanted region 2109 at a selected depth. An energy source increases a global energy level of the substrate using a light beam or heat source to a level above the cleave front propagation energy state, but lower than the energy state necessary to initiate the cleave front. The substrate undergoes a rotational force turning clockwise 2101 on top surface and a rotational force turning counter-clockwise 2103 on the bottom surface which creates stress at the implanted region 2109 to initiate a cleave front. Alternatively, the top surface undergoes a counter-clockwise rotational force and the bottom surface undergoes a clockwise rotational force. Of course, the direction of the force generally does not matter in this embodiment.

FIG. 22 is a simplified diagram of an energy state for the controlled cleaving action using the rotational force according to the present invention. This diagram is merely an illustration, and should not limit the scope of the claims herein. As previously noted, the energy level or state of the substrate is raised using a global energy source (e.g., thermal, beam) above the cleave front propagation energy state, but is lower than the energy state necessary to initiate the cleave front. To initiate the cleave front, a mechanical energy means such as rotational force applied to the implanted region initiates the cleave front. In particular, rotational force applied to the implanted region of the substrates creates zero stress at the center of the substrate and greatest at the periphery, essentially being proportional to the radius. In this example, the central initiating pulse causes a radially expanding cleave front to cleave the substrate.

The removed material region provides a thin film of GaN material for processing. The GaN material possesses limited surface roughness and desired planarity characteristics for use in a epitaxial growth substrate. In certain embodiments, the surface roughness of the detached film has features that are less than about 60 nm, or less than about 40 nm, or less than about 20 nm. Accordingly, embodiments of the present invention may provide thin GaN films which can be smoother and more uniform than pre-existing techniques.

In a specific embodiment, the energy source can be a fluid jet that is pressurized (e.g., compressional) according to an embodiment of the present invention. FIG. 23A shows a simplified cross-sectional view diagram of a fluid jet from a fluid nozzle 2308 used to perform the controlled cleaving process according to an embodiment of the present invention. The fluid jet 2307 (or liquid jet or gas jet) impinges on an edge region of substrate 10 to initiate the controlled cleaving process. The fluid jet from a compressed or pressurized fluid source is directed to a region at the selected depth 2303 to cleave a thickness of material region 12 from substrate 10 using force, e.g., mechanical, chemical, thermal. As shown, the fluid jet separates substrate 10 into two regions, including region 2309 and region 2311 that separate from each other at selected depth 2303. The fluid jet can also be adjusted to initiate and maintain the controlled cleaving process to separate material 12 from substrate 10. Depending upon the application, the fluid jet can be adjusted in direction, location, and magnitude to achieve the desired controlled cleaving process. The fluid jet can be a liquid jet or a gas jet or a combination of liquid and gas. The fluid jet can separate a thin film from the substrate at ambient (i.e., room) temperature, but the substrate and/or jet can also be heated or cooled to facilitate the separation process.

In an embodiment, the energy source can be a compressional source such as, for example, compressed fluid that is static. FIG. 23B shows a simplified cross-sectional view diagram of a compressed fluid source 2307 according to an embodiment of the present invention. The compressed fluid source 2307 (e.g., pressurized liquid, pressurized gas) is applied to a sealed chamber 2321, which surrounds a periphery or edge of the substrate 10. As shown, the chamber is enclosed by device 2323, which is sealed by, for example, O-rings 2325 or the like, and which surrounds the outer edge of the substrate. The chamber has a pressure maintained at PC that is applied to the edge region of substrate 10 to initiate the controlled cleaving process at the selected depth of implanted material. The outer surface or face of the substrate is maintained at pressure PA which can be ambient pressure e.g., 1 atmosphere or less. A pressure differential exists between the pressure in the chamber, which is higher, and the ambient pressure. The pressure difference applies force to the implanted region at the selected depth 2303. The implanted region at the selected depth is structurally weaker than surrounding regions, including any bonded regions. Force is applied via the pressure differential until the controlled cleaving process is initiated. The controlled cleaving process separates the thickness of material 2309 from substrate material 2311 to split the thickness of material from the substrate material at the selected depth. Additionally, pressure PC forces material region 12 to separate by a "prying action" from substrate material 2311. During the cleaving process, the pressure in the chamber can also be adjusted to initiate and maintain the controlled cleaving process to separate material 12 from substrate 10. Depending upon the application, the pressure can be adjusted in magnitude to achieve the desired controlled cleaving process. The fluid pressure can be derived from a liquid or a gas or a combination of liquid and gas. Optionally, a mechanical force, as from a pin or blade, may be applied to the edge of the implanted region to initiate the cleaving process, which typically reduces the maximum pressure differential required between the chamber and the ambient.

Embodiments may be practiced at temperatures that are lower than those used by pre-existing techniques. In particular, embodiments do not require increasing the entire substrate temperature to initiate and sustain the cleaving action as pre-existing techniques. In some embodiments for GaN wafers and hydrogen implants, substrate temperature does not exceed about 500 C. during the cleaving process. Alternatively, substrate temperature does not exceed about 400 C. during the cleaving process. Alternatively, substrate temperature is kept substantially below implanting temperatures via a thermal sink, e.g., cooling fluid, cryogenic fluid. Accordingly, embodiments of the present invention may reduce a possibility of unnecessary damage from an excessive release of energy from random cleave fronts, which generally improves surface quality of a detached film(s) and/or the substrate(s). Accordingly, embodiments of the present invention may provide resulting films on substrates at higher overall yields and quality.

The above embodiments are described in terms of cleaving a thin film of material from a substrate. The substrate, however, can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic, thermo-compression. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electro-statics, adhesives, interatomic. Some of these bonding techniques are described herein. The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

2. GaN HB-LED Growth Substrate Process

A process for fabricating a GaN HB-LED growth substrate according to the present invention may be briefly outlined as follows:

(1) Provide a donor GaN wafer (which may be a multi-stack wafer comprising a GaN layer bonded onto a metal or metal-alloy substrate and optionally coated with additional layers of material);

(2) Introduce particles into the donor GaN wafer to a selected depth to define a thickness of GaN film;

(3) Provide a target substrate material (which may be coated with thin-film(s) of material);

(4) Bond the donor GaN wafer to the target substrate material by joining the implanted face to the target substrate material;

(5) Increase global stress (or energy) of implanted region at selected depth without initiating a cleaving action (optional);

(6) Provide stress (or energy) to a selected region of the bonded substrates to initiate a controlled cleaving action at the selected depth;

(7) Provide additional energy to the bonded substrates to sustain the controlled cleaving action to free the thickness of GaN film from the donor GaN wafer (optional);

(8) Complete bonding of donor GaN wafer to the target substrate; and (9) Polish a surface of the thickness of GaN film.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. This sequence of steps is merely an example and should not limit the scope of the claims defined herein. Further details with regard to the above sequence of steps described below.

Figure 24:
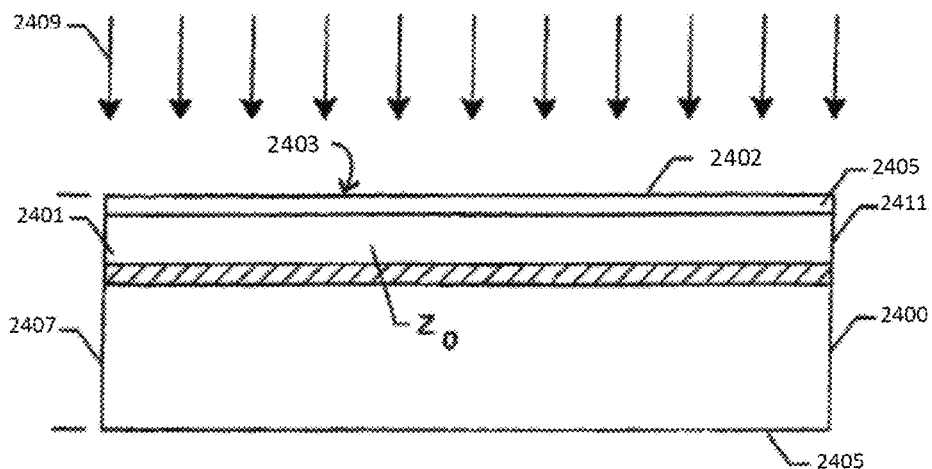
FIG. 24 is a simplified diagram illustrating the use of energetic particles to implant a donor substrate comprising semiconductor material, with optional surface layers to form a cleave plane.

FIGS. 24-29 are simplified cross-sectional view diagrams of substrates undergoing a fabrication process for a GaN HB-LED growth wafer according to embodiments of the present invention. The process begins by providing a semiconductor substrate similar to the GaN wafer 2400, as shown by FIG. 24. Substrate or donor includes a material region 2401 to be removed, which is a thin relatively uniform film derived from the substrate material. The GaN wafer includes a top surface 2403, a bottom surface 2405, and a thickness 2407. Material region also includes a thickness (z0), within the thickness 2407 of the GaN wafer. Optionally, a layer or layer stack 2402 (e.g., metal films) overlies the top surface of the substrate. The present process provides a novel technique for removing the material region 2401 using the following sequence of steps for the fabrication of a GaN HB-LED growth wafer.

If a substitutional GaN HB-LED growth substrate comprising a sapphire workpiece or target substrate with a high-quality GaN growth surface is desired, a modified bond process using insulating layer(s) may be selected. In a particular embodiment, both the GaN surface and the sapphire target substrate can be coated with a bond promoting layer such as a silicon dioxide film and/or an aluminum nitride film. For the GaN donor, this oxide film may be of limited thickness to allow the desired implant depth. For example, a 50 nm film would lower the GaN cleave layer from 250 nm to 200 nm. The oxide film thickness on the sapphire substrate can be selected from a wide range of values that allow good bond yield and device performance. Typical oxide film thickness for the sapphire workpiece is 75-200 nm. One or more films can be applied using a RF or reactive sputtering process or via plasma-enhanced CVD (PECVD) process. In some embodiments an insulating film can be spun on.

After deposition, the low temperature films may be treated to promote good bondability. Typical treatment conditions can include a densification anneal and a clean/etch chemical bath that removes asperities and surface contaminants.

The densification anneal is done in an inert environment at 700-1000° C. for typically 1-10 minutes using a Rapid Thermal Processing or 30-60 minutes in a furnace. Incorporated by reference herein for all purposes is the following paper to Choi et al.: "Densification of Radio Frequency Sputtered Silicon Oxide Films by Rapid Thermal Annealing", Journal of Applied Physics, Vol. 83, No. 4 (February 1998). The oxide film on the GaN can also act as a capping layer which limits GaN decomposition.

Because the densification anneal is typically done at high temperatures, the implant step may be performed after the anneal so as to protect the hydrogen cleave plane from diffusing and being rendered ineffective.

Figure 32A:
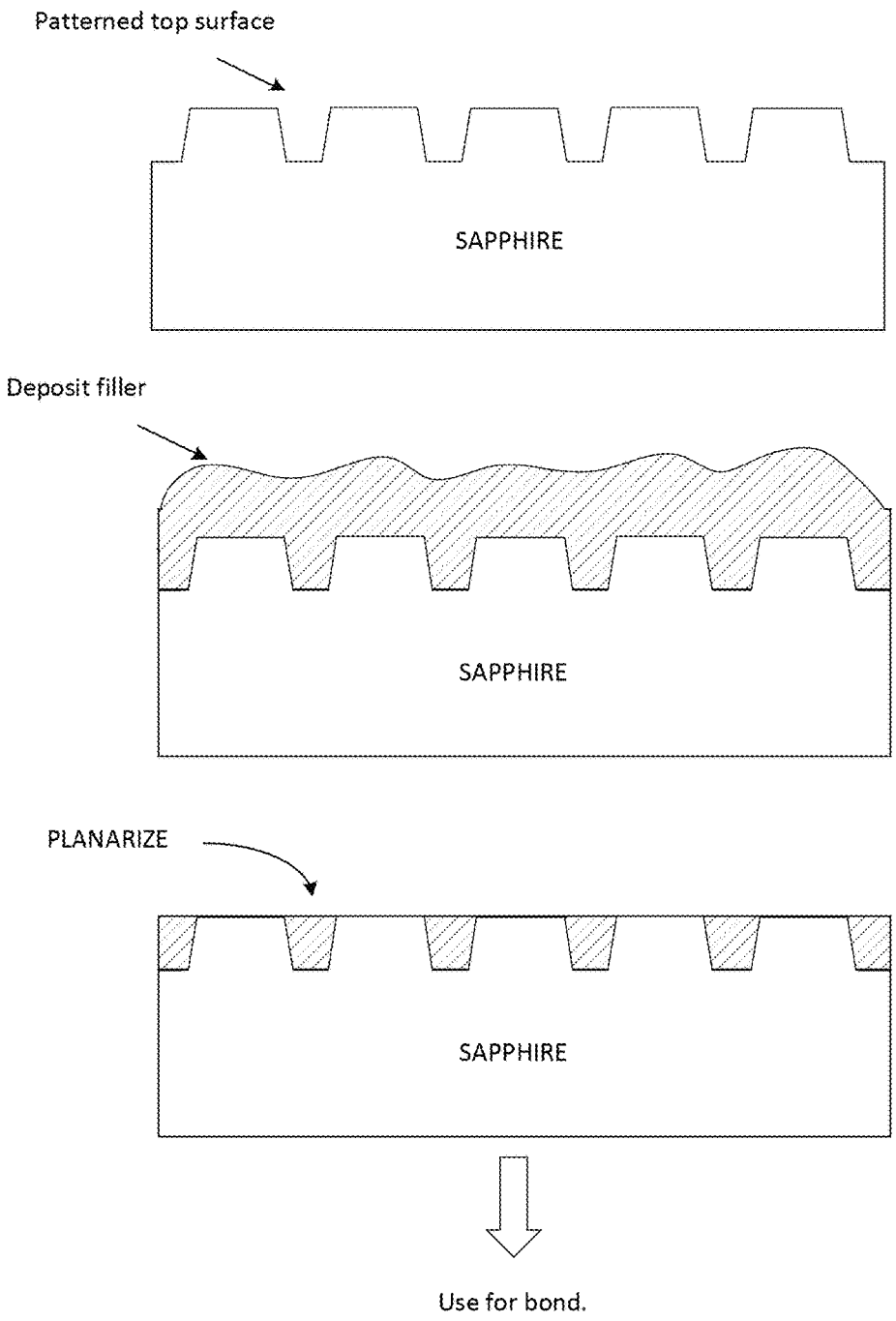
FIG. 32A shows an embodiment of a process sequence for an integrated pattern on the sapphire substrate to allow light extraction methods similar to PSS (Patterned Sapphire Substrate).

The sapphire substrate can be of different varieties to allow a substitutional sapphire-based growth template to meet the desired specifications. The following are some of the structure and options that can be integrated within this substrate:

1. a single-side polished sapphire for low-cost;
2. a double-side polished sapphire to allow laser lift-off back-end LED manufacturing where the LED layer is removed from the sapphire growth substrate;
3. an integrated pattern on the sapphire substrate to allow light extraction methods similar to PSS (Patterned Sapphire Substrate). Film deposition and planarization steps may be required to allow bonding. FIG. 32A shows an embodiment of a process sequence. Note the index of refraction of the filler material needs to be selected to allow the scattering effect to occur efficiently. Aluminum nitride and silicon dioxide may be used.
4. Integrating a reflector layer on a planar or PSS sapphire surface that will act as a mirror layer. Electrical conductivity may also be achieved if the planarization and bonding allows the surface to have exposed metal. FIG. 32B shows an embodiment of the process sequence where the top planarized layer can contain electrically conductive islands.

Selected energetic particles 2409 implant through the top surface of the donor GaN wafer to a selected depth, which defines the thickness of the material region, termed the thin film of material. As shown, the particles have a desired concentration 2411 at the selected depth (z0). A variety of techniques can be used to implant the energetic particles into the donor GaN wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

Figure 25:
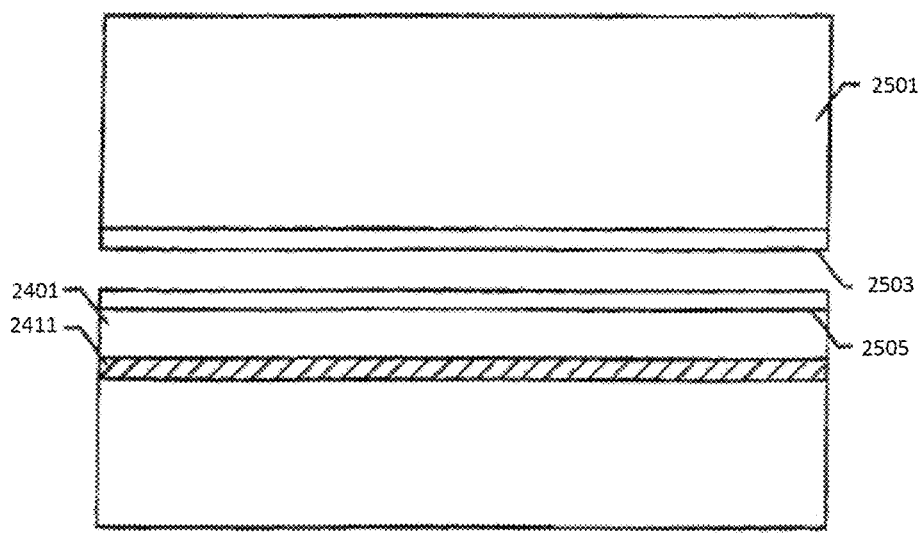
FIGS. 25-29 are simplified cross-sectional view diagrams illustrating a method of forming a silicon-on-insulator substrate.

The process uses a step of joining the implanted donor GaN wafer 2400 to a workpiece 2501 or target wafer, as illustrated in FIG. 25. The workpiece may also be a variety of other types of substrates such as those made of a dielectric material (e.g., quartz, glass, sapphire, silicon nitride, silicon dioxide, aluminum nitride), a conductive material (silicon, polysilicon, group III/V materials, metal), and plastics (e.g., polyimide-based materials). In the present example, however, the workpiece is a CTE-matched metal wafer.

In a specific embodiment, the GaN donor and target wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of H2O2-H2SO4. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning In particular, plasma cleaning activates the wafer surface using a plasma derived from gases such as argon, ammonia, neon, water vapor, nitrogen, and oxygen. The activated wafer surface 2503 is placed against a face of the other wafer, which has a coat of oxidation 2505 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g. 150 to 250 C.) often needed to cure the SOG after it is applied to surfaces of the wafers.

Alternatively, a variety of other low temperature techniques can be used to join the donor wafer to the target wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques such as thermo-compression bonding. Of course, the technique used depends upon the application.

Figure 26:
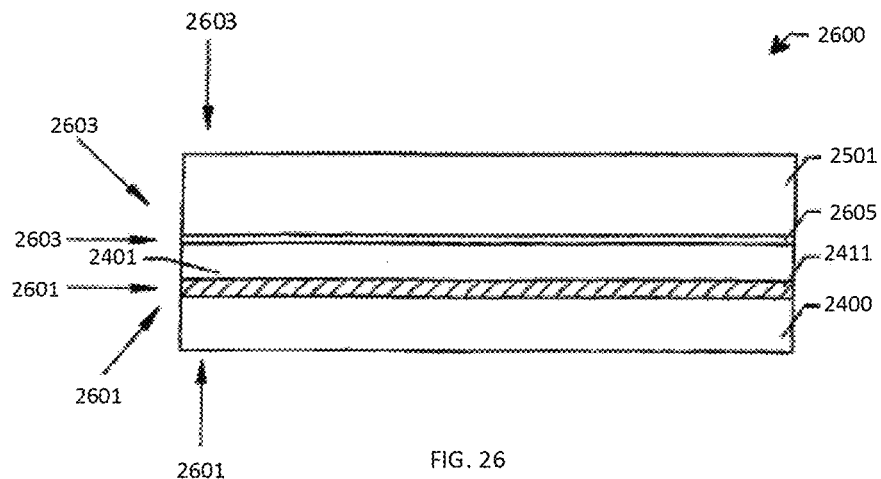

After bonding the wafers into a sandwiched structure 2600, as shown in FIG. 26, the method includes a controlled cleaving action to remove the substrate material to provide a thin film of substrate material 2401 overlying interface layer(s) 2605 on the target metal wafer 2501. The controlled-cleaving occurs by way of selective energy placement or positioning or targeting 2601, 2603 of energy sources onto the donor and/or target wafers. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others and is illustrated by way of FIG. 26. For instance, a process for initiating the controlled cleaving action uses a step of providing energy 2601, 2603 to a selected region of the substrate to initiate a controlled cleaving action at the selected depth (z0) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In an embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. In certain embodiments, the method uses a global thermal source and a mechanical source to initiate and maintain the cleaving action.

Figure 27:
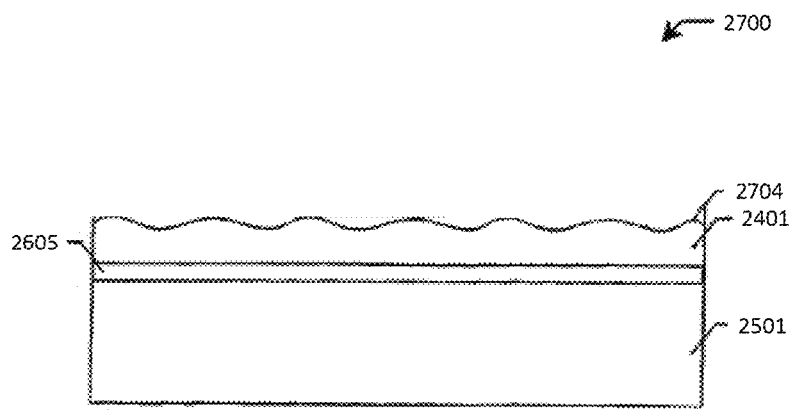

A final bonding step occurs between the target wafer 2501 and thin film of material region 2501 according to some embodiments, as illustrated by FIG. 27. In one embodiment, one metal wafer 2400 has overlying layers of metallic and conductive material including a bond layer of copper 2505, which is deposited overlying the face before cleaving the thin film of material, as shown in FIG. 25. The copper layer 2505 can also be formed using a variety of other techniques, e.g., sputtering. The copper layer 2505 between the wafer surfaces are fused together using thermal-compression bonding. Typical thermo-compression processes for Copper-Copper bonding are (i) temperatures between 100-400 C, (ii) pressures between 0.5-1 MPa and (iii) process time from a few minutes to a few hours depending on exact conditions.

Under certain conditions, it may be advantageous to change the copper thickness ratio from 50/50 between the donor and target substrate, to one where the donor copper thickness is minimized in order to move the bond layer as close as possible to the cleave plane to facilitate cleave initiation. For example 1 um/1 um copper thermo-compression bond layers can be redesigned to become 0.25 um/2 um (donor Cu thickness/target substrate Cu thickness), to move the bond interface to about 0.25 um from the donor material surface. Using Ansys simulation, the initiation moment-energy coupling is improved from 25% to 31% of the reference configuration during cleave propagation (bond interface coincident with the cleave interface).

Another method to reduce initiation energy according to certain embodiments, would include removing or "trenching" a limited edge area of the donor substrate coincident with the initiation area prior to bonding. This can increase the edge initiation energy at the cleave plane by 2-3×. This result and improvement was confirmed by using Ansys finite analysis simulations.

In particular, FIGS. 30 and 31 show the non-cut and cut configuration where Double-Cantilevered Cleave (DCB) mechanical loading is applied and the cleave plane energy is calculated. The simulation has the following substrate/layers (from bottom to top):
1. Bottom: Donor Mo substrate (48 um), E=330 GPa
2. GaN sub cleave plane layers (2): 2 um+0.25 um bottom cleave "image" layer E=205 GPa
3. GaN cleave layer: 0.25 um film is the overlying GaN layer over the cleave plane E=205 GPa
4. Reflector/interface layer: 0.25 um E=70 GPa
5. Copper Bond layers (2): bottom 0.25 um+top 2 um E=110 GPa Bond interface is between these two layers
6. Top: Target Mo substrate (47.5 um), E=330 GPa
Point A is the Cu—Cu bond interface. Point B is the cleave plane area of interest.

The DCB configuration is loaded by applying a moment of 0.1 N-m/m to each of the substrates in a separating direction. The reference DCB mechanical release energy is calculated using the well known DCB equation $G_I=12M^2/Eh^3$ (h is the substrate thickness and E is dominated by the Mo Young's Modulus). With the loading and Mo Young's Modulus used, the equation yields an expected $G_I$ of 2.92 $J/m^2$. The reference energy (with the crack at point B with left GaN surface unbonded and with continuous Cu—Cu bond) was simulated and gave an energy of 2.91 $J/m^2$, close to the calculated $G_I$ value. $G_{II}$ was shown to be small (less than 1%) in all cases and thus the configuration can be deemed to be $K_I$ dominant.

Using the configuration of FIG. 30, the Cu—Cu interface to the left of point A is now unbonded while the GaN interface to the left of point B is now bonded. This corresponds to the non-initiated loading. Ansys simulation result shows the $G_I$ energy just to the right of the point B reaches only 0.86 $J/m^2$, about 31% of the reference. This implies that more loading will be required to initiate a crack within the GaN layer prior to a higher yielding cleave propagation energy of 2.91 $J/m^2$ can be realized. To reduce the initiation energy, removal of the GaN layers edge layers 3, 4 and the lower Cu layer 5 can improve the moment-energy coupling substantially.

FIG. 31 shows this modified configuration where these layers are cut, etched or otherwise removed at the initiation area. The Ansys simulation of this configuration shows a much higher moment-energy coupling with $G_I$ of 2.91 $J/m^2$, essentially back up to 100% of the reference $G_I$ energy. This shows that uncovering the edge area of the cleave plane can substantially improve the initiation moment-energy coupling.

After bonding the wafers, the GaN HB-LED growth substrate has a target substrate 2501 with an overlying film of GaN material 2401 and a sandwiched metallic, reflective layers 2505 between the target substrate 2501 and the target metal wafer 2400, as also illustrated in FIG. 25. The detached surface of the film of GaN material is often rough 2704 and needs finishing. Finishing occurs using a combination of grinding and/or polishing techniques.

In some embodiments, the detached surface undergoes lapping and polishing steps using, for examples, techniques such as rotating an abrasive material underlaying the detached surface to remove any imperfections or surface roughness therefrom. A machine such as a "PM5 lapping & polishing system" made by a company called Logitech Limited of Glasgow, Scotland (UK) may provide this technique.

Figure 28:
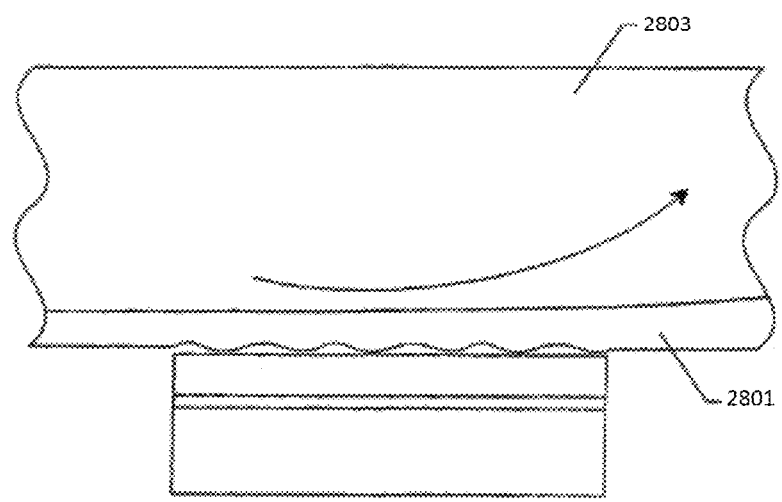

Alternatively, chemical mechanical polishing or planarization ("CMP") techniques finish the detached surface of the film, as illustrated by FIG. 28. In CMP, a slurry mixture is dripped directly to a polishing surface 2801 which is attached to a rotating platen 2803. This slurry mixture can be transferred to the polishing surface by way of a chute, which is coupled to a slurry source. The slurry is often a solution containing alumina abrasive particles and an oxidizer, e.g., sodium hypochlorite (NaOCl) or alkaline colloidal silica, which are sold under trade names of SF1 or Chemlox by Logitech Limited. The abrasive is often an aluminum oxide, aluminum trioxide, amorphous silica, silicon carbide, diamond powder, and any mixtures thereof. This abrasive is mixed in a solution of deionized water and oxidizer or the like. The solution may be acidic.

Figure 29:
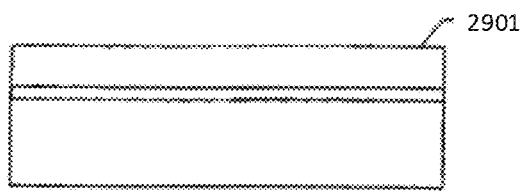

This acid solution generally interacts with the gallium nitride material from the wafer during the polishing process. The polishing process preferably uses a very rigid polyurethane polishing pad. An example of this polishing pad is one made by Rodel and sold under the trade name of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface 2901 for subsequent processing, as illustrated by FIG. 29. Depending on whether N-face or Ga-face GaN is to be polished off, slurry with suitable abrasive particle sizes and polishing pads may be used accordingly. As examples, colloidal silica may be used for N-face and sodium hypochlorite may be used for Ga-face.

Other than and/or in addition to polishing, there are a number of other surface preparation options that can be employed to prepare the surface condition of the GaN layer, once it has been transferred from the high quality single crystal GaN bulk substrate to the workpiece. A purpose of this surface preparation is to recover the crystalline quality of the transferred GaN layer that may be compromised or damaged due to the implantation or cleaving step.

a. Thermal annealing in a furnace with or without a protective cap, such as silicon dioxide or AlN. This cap is required if the anneal temperature and ambient gas conditions.

b. For GaN in 1 atm nitrogen ambient, the decomposition temperature of the GaN can be as low as 800-900° C. If a cap layer is used, the anneal temperature without GaN crystal decomposition can be substantially higher.

c. Plasma dry etch to remove a limited thickness of the GaN surface to remove the damaged surface region and allow high-quality epitaxial growth.

d. Wet chemical etch to remove a limited thickness of the GaN surface to remove the damaged surface region and allow high-quality epitaxial growth.

e. Anneal and etch in a MOCVD reactor prior to epitaxial GaN growth. This is similar technique as a. above, except that this can be done in-situ in an MOCVD reactor.

It is of course also possible to use the as-cleaved GaN surface without prior surface preparation if the subsequent epitaxial growth step yields a GaN crystal of sufficient quality. As referenced herein and in the figures, the term "polish" may refer to some sort of surface treatment, which may or may/not include polishing, depending upon the particular embodiment.

Although the above description is in terms of a donor GaN wafer, other substrates may also be used. For example, the substrate can be almost any monocrystalline, polycrystalline, or even amorphous type substrate. Additionally, the substrate can be made of III/V materials such as gallium arsenide or Group IV materials such as silicon, silicon carbide, sapphire, and others. The multi-layered substrate can also be used according to the present invention. The multi-layered substrate includes a GaN layer substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

Another embodiment may attach a film of single-crystal film that can serve as a heteroepitaxial growth seed layer. The attachment could occur by placing a frame of the thin crystalline metallic film onto the target substrate and cutting the film at the periphery. The film can be then made permanent by a thermal treatment or the like. Examples of metallic single-crystal films for GaN heteroepitaxial growth are Cu (111) & (110), Mo (111) & (110) using buffer layers such as AlN and HfN. Other metals such as Ag have also been studied as seed layers for GaN growth. Since these metals have ductile properties, in some cases a negative lattice mismatch (metal lattice spacing <GaN lattice spacing) can be addressed by stretching the film prior to mounting onto the target substrate.

Another embodiment of the present invention provides a method that includes providing a semiconductor workpiece including a surface region, introducing a plurality of particles through the surface region to form a cleave region in the semiconductor workpiece, applying energy to cleave a detached thickness of semiconductor material from a remainder of the semiconductor workpiece, and bonding the detached thickness of semiconductor material to a substrate having a coefficient of thermal expansion approximately equal to a coefficient of thermal expansion of the layer of additional material.

In an embodiment, the bonding comprises releasable bonding between the additional layer of material and the substrate.

In an embodiment, the releasable bonding is based upon a surface roughness of the detached thickness of semiconductor material and/or a surface roughness of the substrate.

In an embodiment, the releasable bonding is based upon a sacrificial material present between a detached thickness of semiconductor material and the substrate.

In an embodiment, the detached thickness of semiconductor material is between about 10-100 um.

In an embodiment, the semiconductor material is bonded and the detached thickness of semiconductor material is between about 0.05-1 um.

In an embodiment, the semiconductor material is bonded and the intervening layers include a reflective layer.

In an embodiment, the semiconductor material is bonded with intervening layers enabling the detached thickness of semiconductor material to be made thermally and electrically conductive to the metal substrate.

In an embodiment, the semiconductor material is bonded with an intervening electrically insulating layer enabling the detached thickness of semiconductor material to be made thermally conductive but electrically insulated to the metal substrate.

In an embodiment, the substrate comprises a metal substrate.

In an embodiment, providing the semiconductor workpiece comprises providing a bulk ingot, and the method further comprises detaching a layer of the semiconductor workpiece bearing the GaN by controlled cleaving.

In an embodiment, the controlled cleaving comprises cleaving along a cleave region formed by implantation of particles through the GaN into the semiconductor workpiece.

In an embodiment, providing the semiconductor workpiece comprises providing a wafer separated from a bulk ingot by sawing.

In an embodiment, the method also includes relaxing a stress in the GaN.

In an embodiment, relaxing the stress comprises removing at least a portion of the semiconductor workpiece.

In another embodiment of the method, the substrate comprises Molybdenum or Molybdenum alloy.

In conclusion, at least the following variations falling within the scope of particular embodiments, are noted.

Certain embodiments may utilize various donor underlying substrates and reflector/barrier/encapsulant layers, including backing technology for enhancing cleaving. According to some embodiments, a donor can comprise GaN, Si, SiC or other semiconductor material. After cleaving, the material may be polished/prepared for further growth.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions or deuterium and hydrogen ions to allow for formation of the cleave plane with a modified dose and/or cleaving properties according to alternative embodiments. Still further, the particles can be introduced by a diffusion process rather than an implantation process. Of course there can be other variations, modifications, and alternatives. Therefore, the above description and illustrations should not be taken as limiting the scope of the present invention which is defined by the appended claims.

What is claimed is:

1. A method comprising:
   providing a GaN workpiece;
   introducing a plurality of particles into a surface of the GaN workpiece to form a cleave region in the GaN workpiece;
   bonding the surface of the GaN workpiece to an insulating substrate, wherein the bonding comprises applying a deposited silicon dioxide film by a spin-on technique and an aluminum nitride film prior to the introducing, wherein the substrate includes a light scattering interface comprising a dielectric filler co-planar with islands of a metal layer to enhance light extraction in light emitting diode applications;
   prior to the introducing, causing the applied silicon dioxide film to undergo a thermal anneal to densify the silicon dioxide film;
   applying energy to cleave a detached thickness of GaN, from a remainder of the GaN workpiece;
   processing the substrate bearing the detached thickness of GaN at a temperature of about 1000° C. to grow additional GaN over the detached thickness by metal-organic chemical vapor deposition.

2. The method as in claim 1 wherein the insulating substrate comprises sapphire.

3. The method as in claim 1 wherein the insulating substrate comprises amorphous aluminum nitride.

4. The method as in claim 1 wherein the applied films undergo an etch step prior to bonding to enhance bond strength.

5. The method as in claim 1 wherein:
   the insulating substrate further comprises a reflecting layer that is positioned between the detached thickness of GaN and the substrate following the application of energy, wherein the reflecting layer comprises the metal layer; and
   processing the substrate to create a light emitting diode device.

6. The method as in claim 1 wherein the GaN is doped p-type or n-type.

7. The method as in claim 1 wherein the GaN is unintentionally doped.

8. The method as in claim 1 wherein the processing comprises performing polishing and/or other surface treatment.

9. The method as in claim 8 wherein the other surface treatment includes annealing.

10. The method as in claim 8 wherein the other surface treatment includes a plasma etch.

11. The method as in claim 8 wherein the other surface treatment includes a chemical etch.

12. The method as in claim 1 wherein the filler comprises the deposited silicon dioxide film.

13. The method as in claim 1 wherein the filler comprises the deposited aluminum nitride film.

* * * * *